United States Patent [19]
Yoshida et al.

[11] Patent Number: 5,428,321
[45] Date of Patent: Jun. 27, 1995

[54] PULSE WIDTH MODULATOR HAVING CONTROLLED DELAY CIRCUIT

[75] Inventors: Hideki Yoshida; Daisuke Murakami, both of Kanagawa, Japan

[73] Assignee: Sony Corporation, Japan

[21] Appl. No.: 280,182

[22] Filed: Jul. 25, 1994

[30] Foreign Application Priority Data

Jul. 30, 1993 [JP] Japan .................. 5-190514
Jul. 30, 1993 [JP] Japan .................. 5-190515
Aug. 2, 1993 [JP] Japan .................. 5-191254

[51] Int. Cl.⁶ ............................................. H03K 7/08
[52] U.S. Cl. ..................................... 332/109; 332/110
[58] Field of Search ................. 332/109, 110; 375/22

[56] References Cited

U.S. PATENT DOCUMENTS 4,819,066 4/1989 Miyagi ............................ 358/456
5,122,726 6/1992 Elliott et al. ..................... 323/272

*Primary Examiner*—Siegfried H. Grimm
*Attorney, Agent, or Firm*—Ronald P. Kananen

[57] ABSTRACT

A pulse width modulation circuit apparatus of a digital type using a delay circuit and a decoder, which is provided with a delay control circuit for driving the reset-set type flip-flop of a last output stage and which provides the flip-flop with a mode determination function, whereby the range of the operation frequency is broadened, the generation of a blank pulse and offset pulse can be suppressed, and a higher precision gradation expression can be realized.

10 Claims, 26 Drawing Sheets

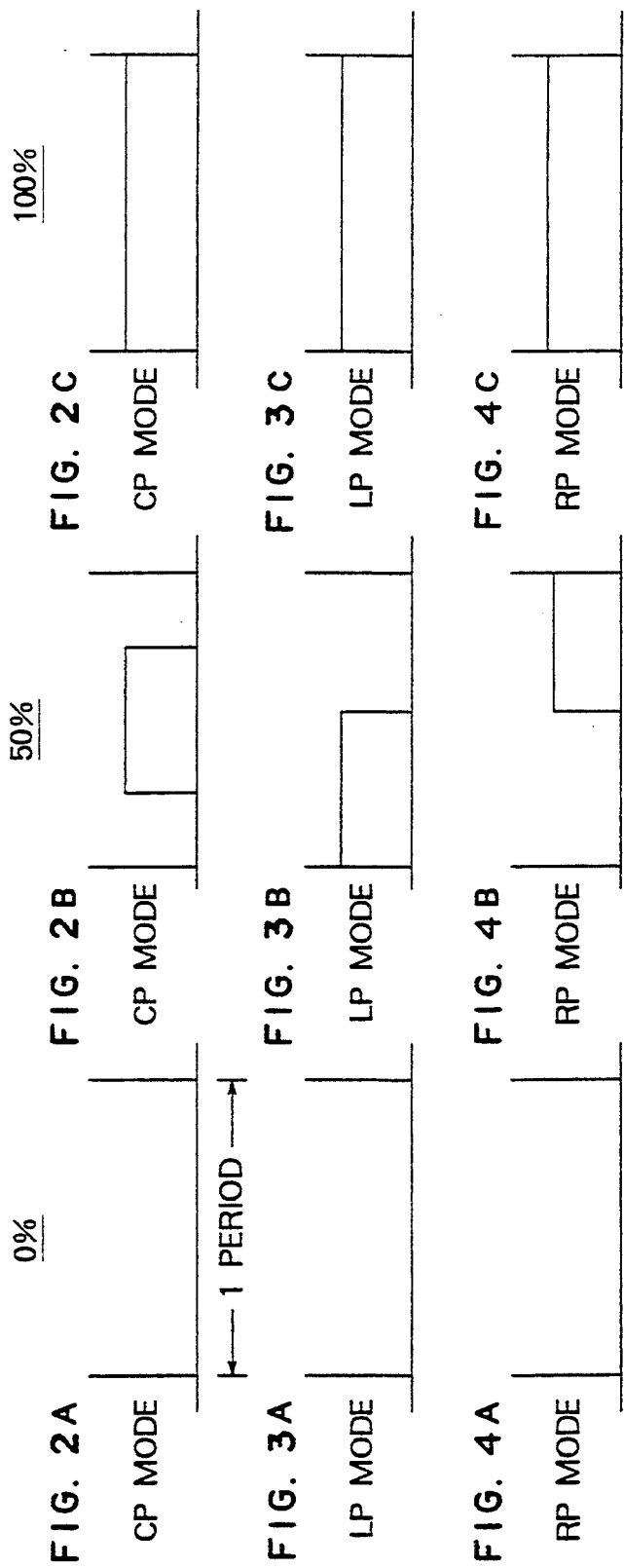

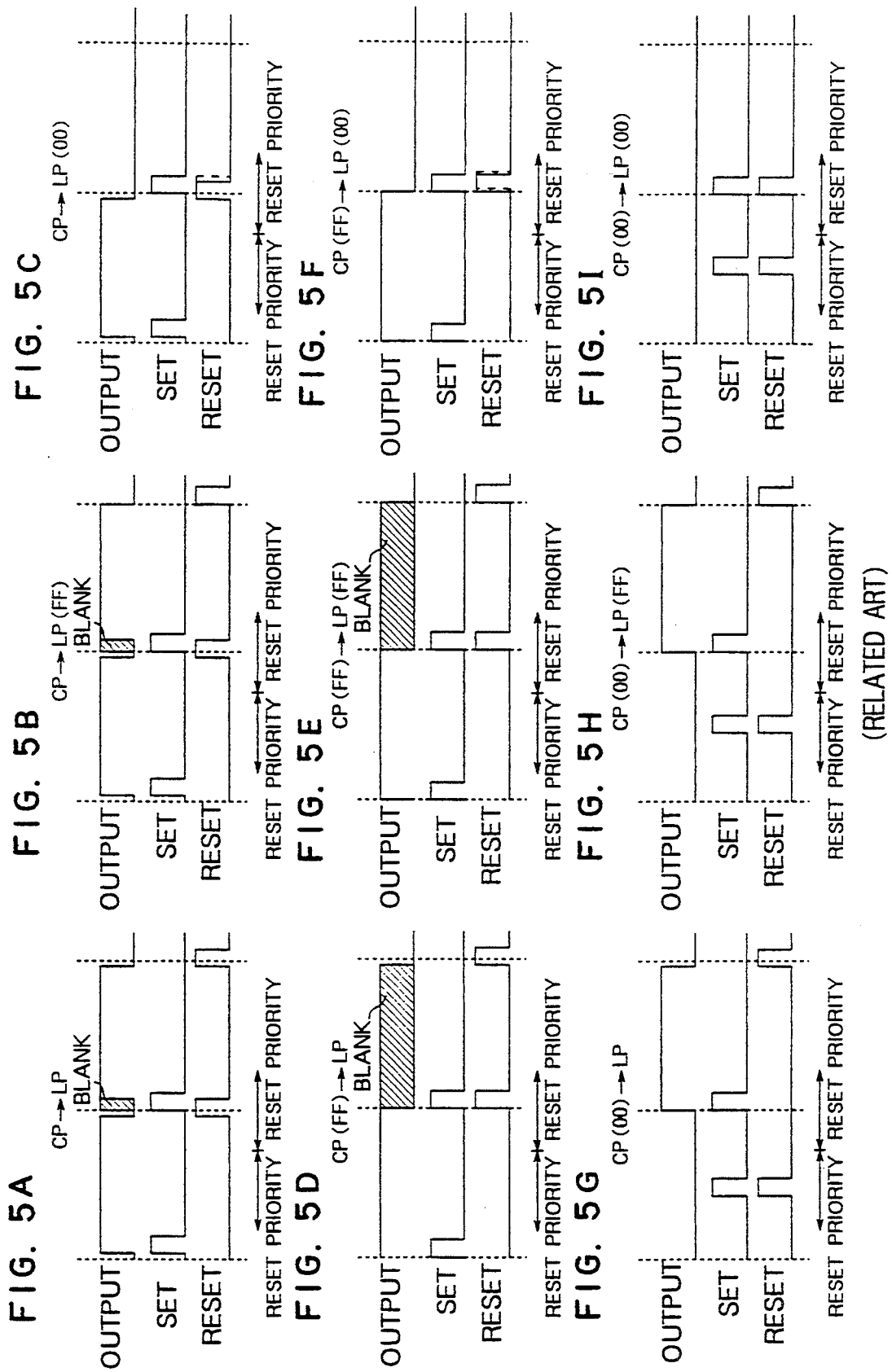

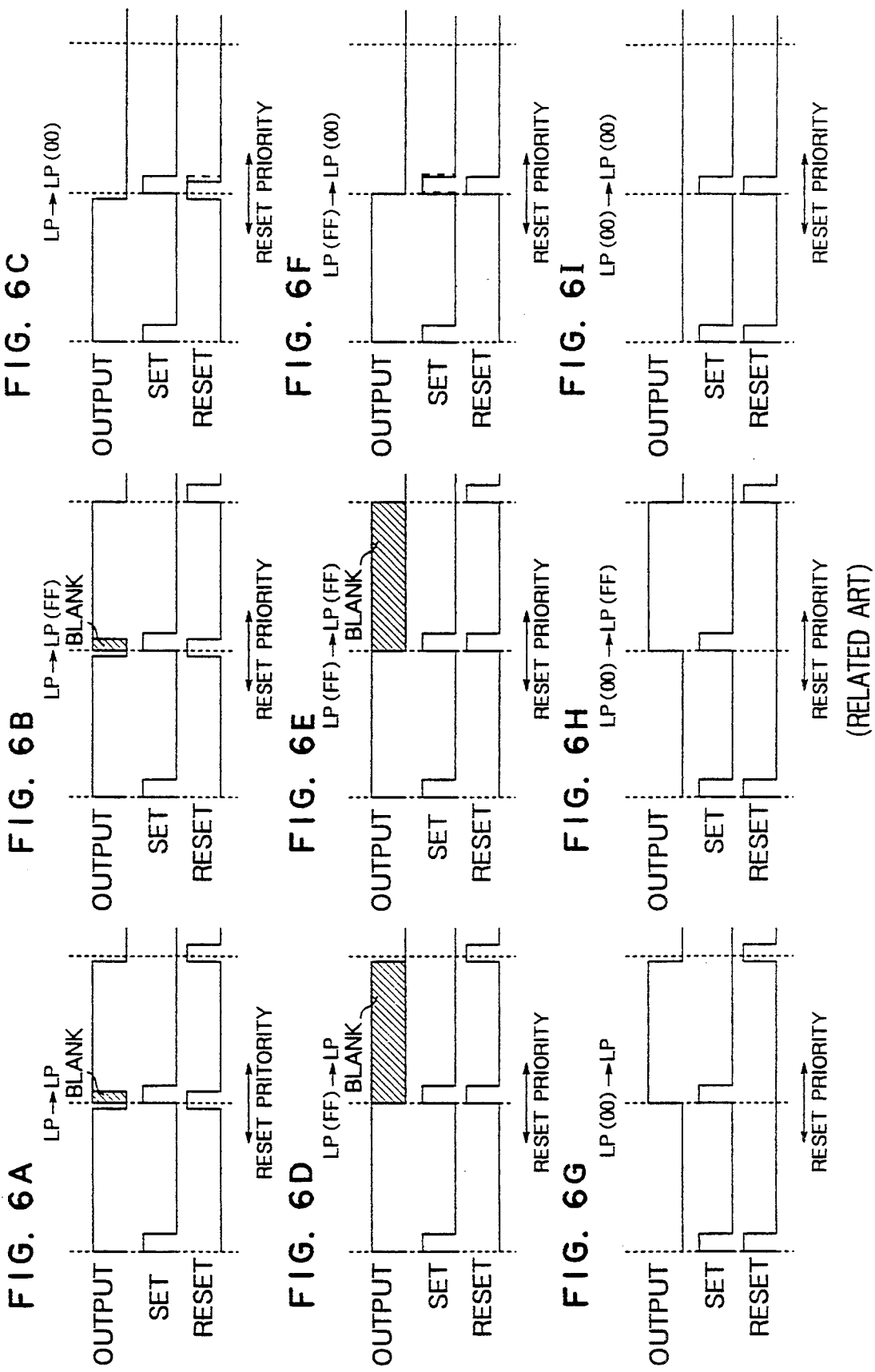

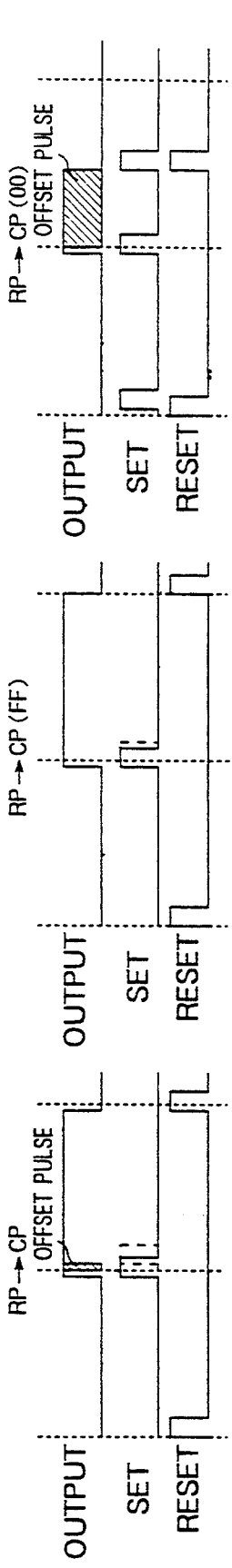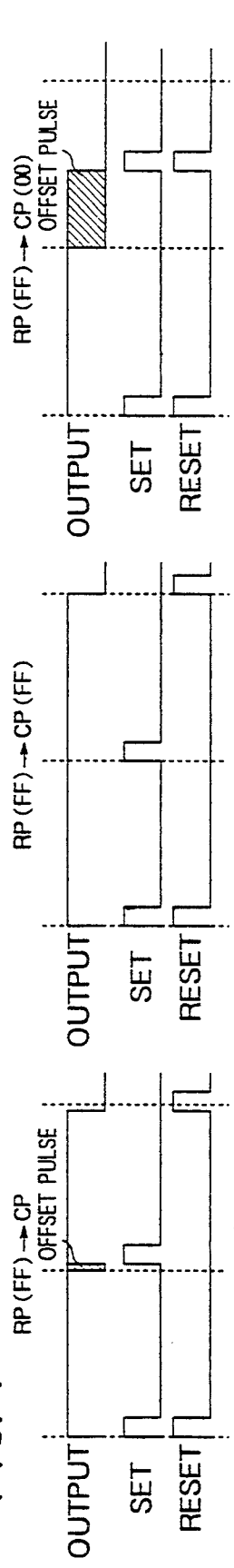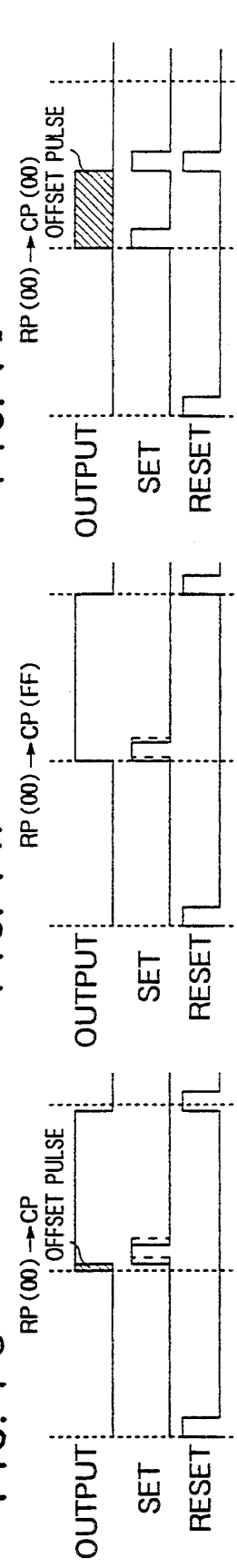
FIG. 7A  FIG. 7B  FIG. 7C
FIG. 7D  FIG. 7E  FIG. 7F
FIG. 7G  FIG. 7H  FIG. 7I
(RELATED ART)

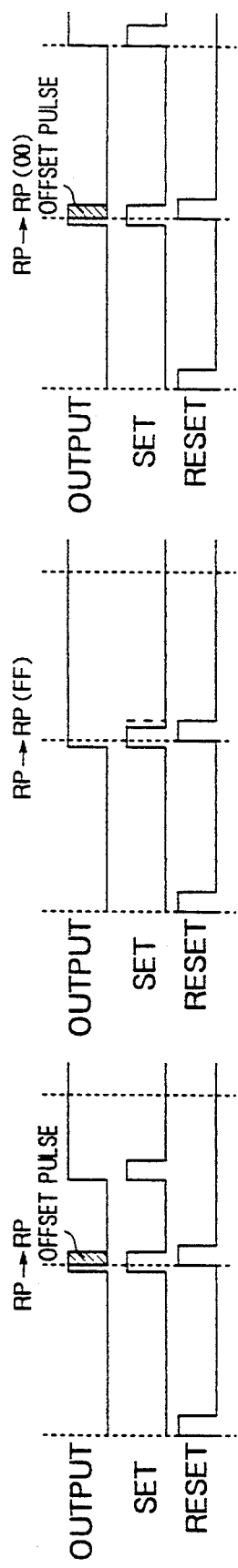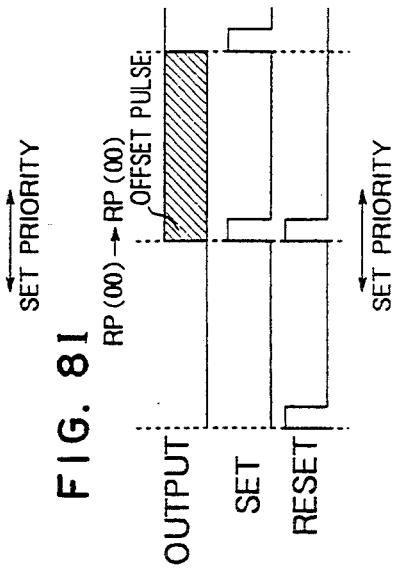

FIG. 16

| FMODE1 | FMODE0 | DECODER OUTPUT (MSB-LSB) | SHIFT No. TO MSB | REPETITION No. |
|---|---|---|---|---|
| 0 | 0 | 00010 | 0 | 2 |
| 0 | 1 | 00100 | 1 | 4 |
| 1 | 0 | 01000 | 2 | 8 |
| 1 | 1 | 10000 | 3 | 16 |

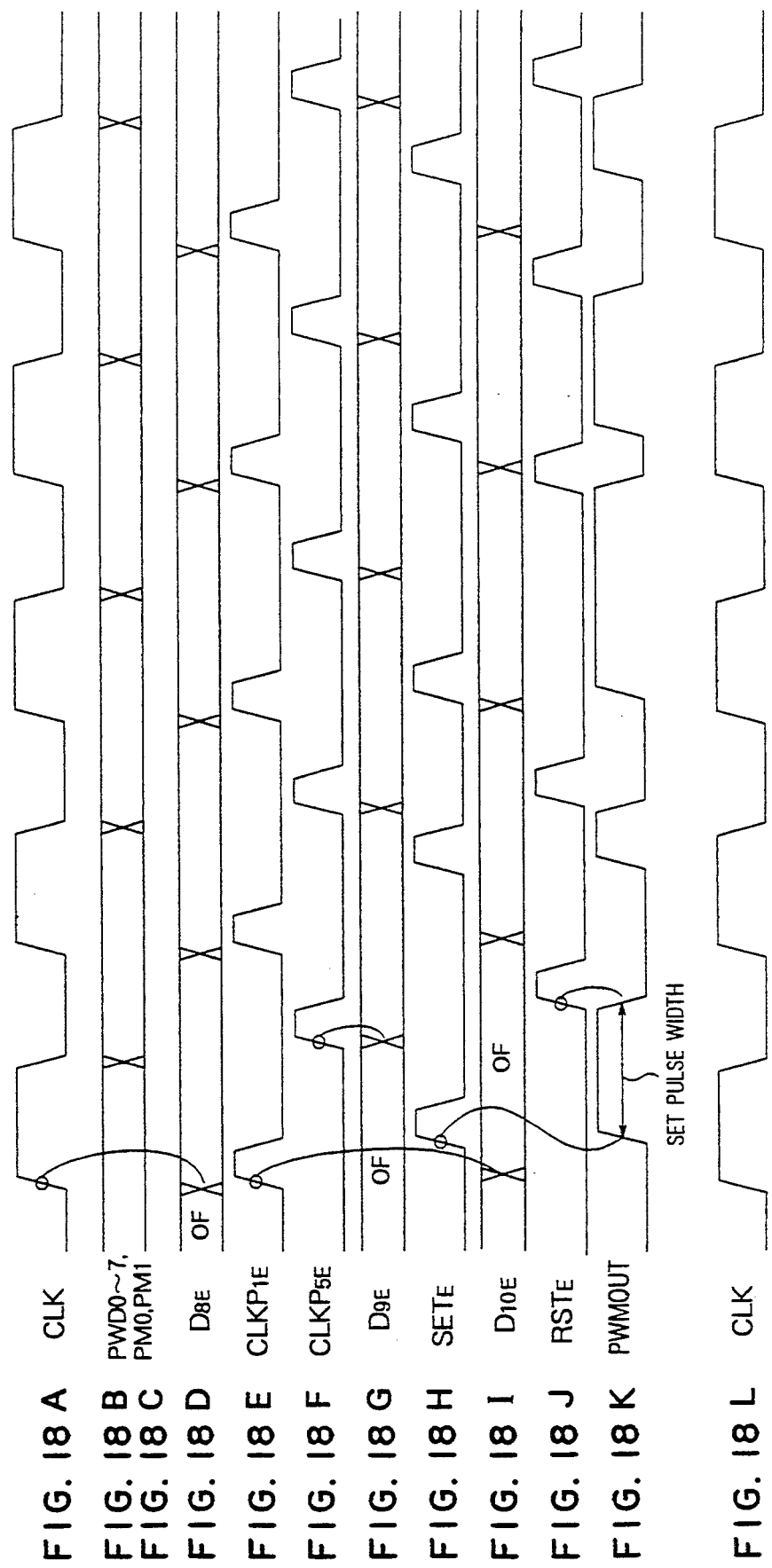

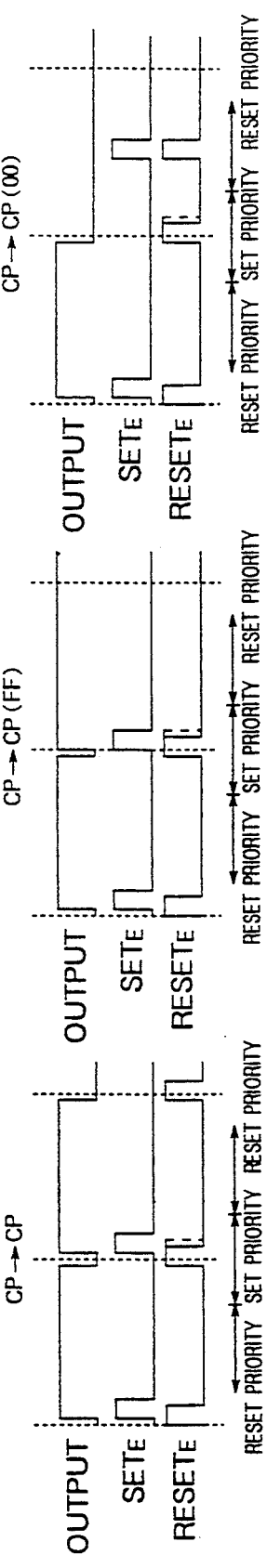
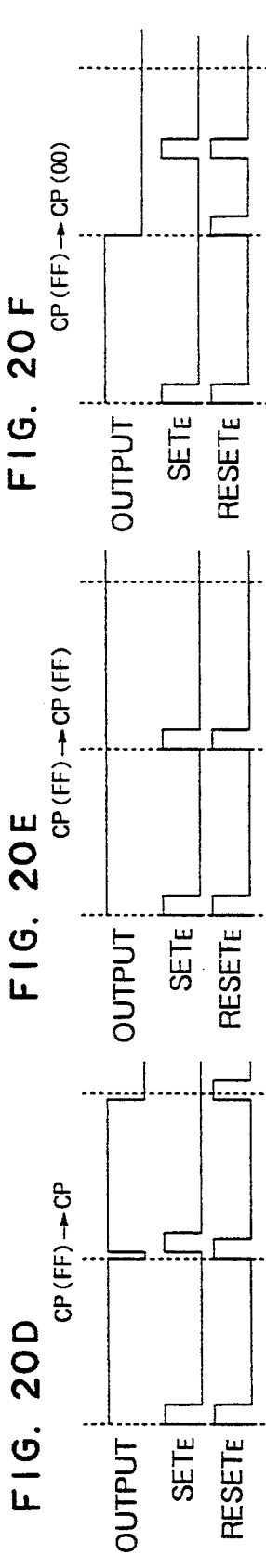
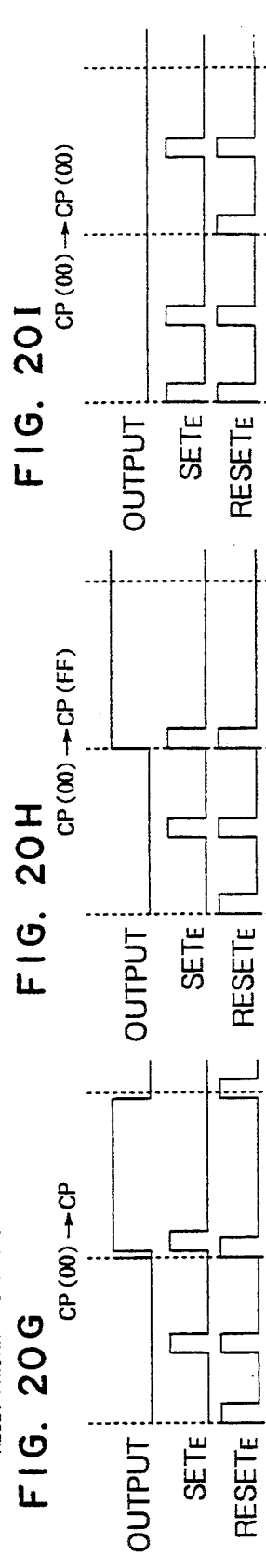
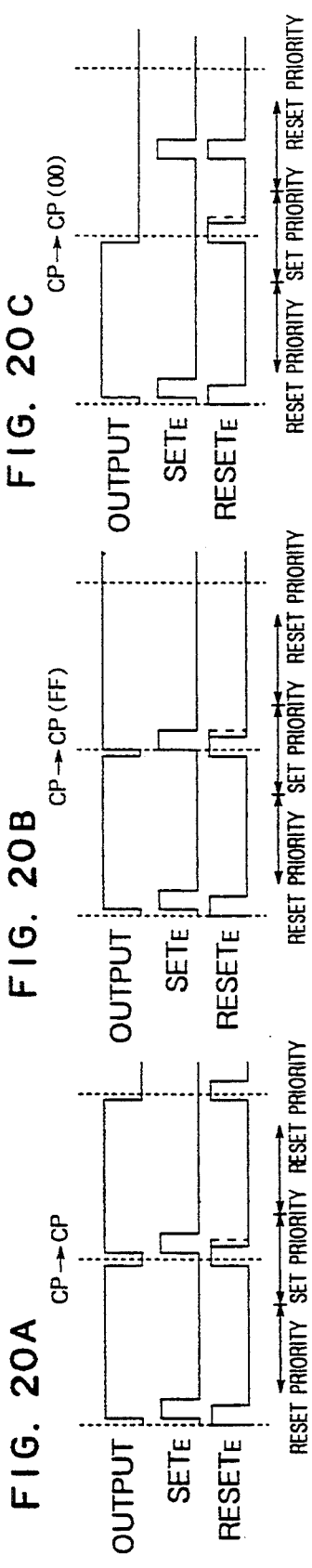
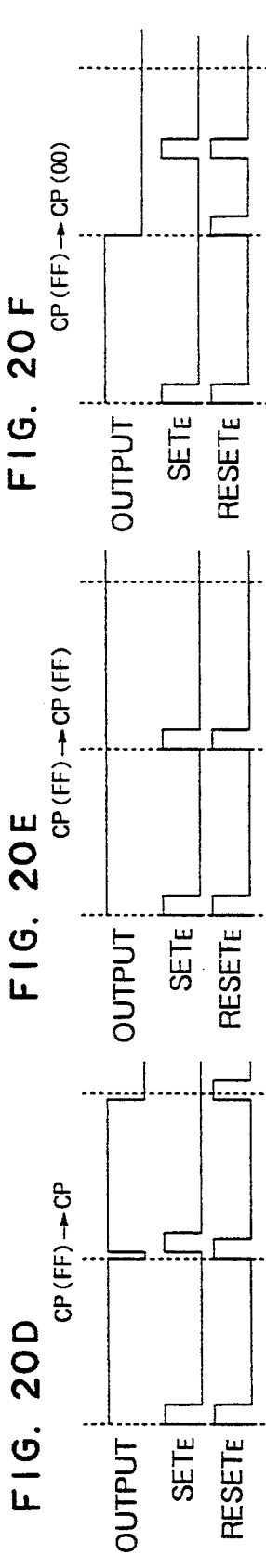
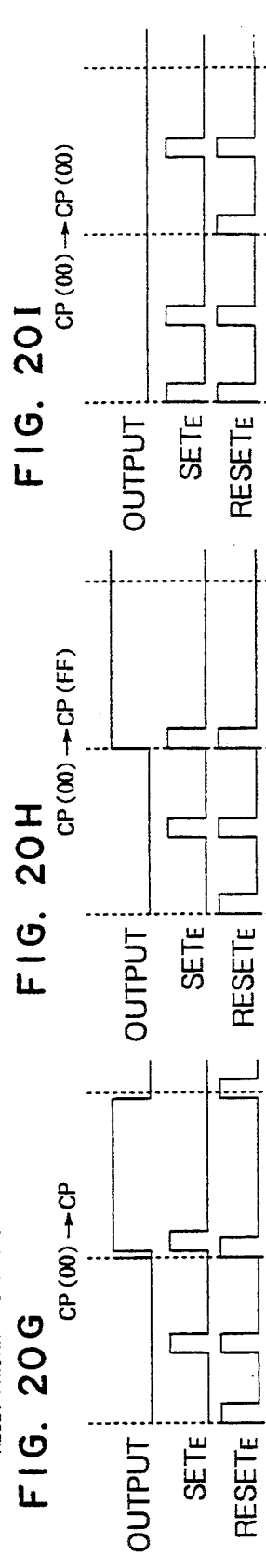

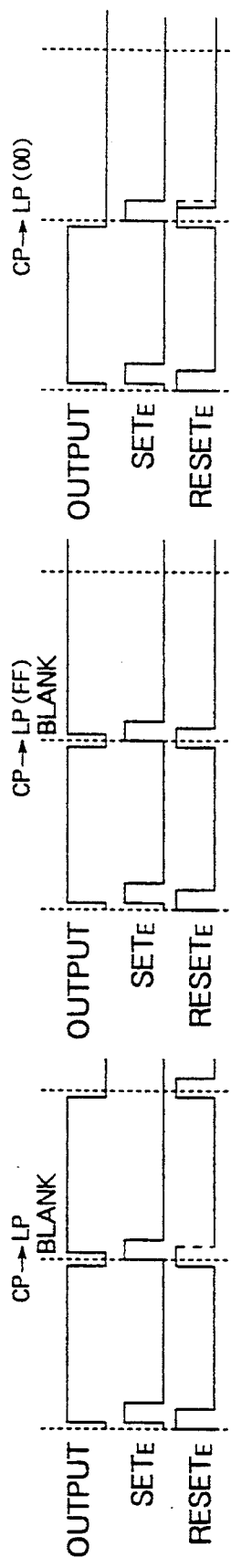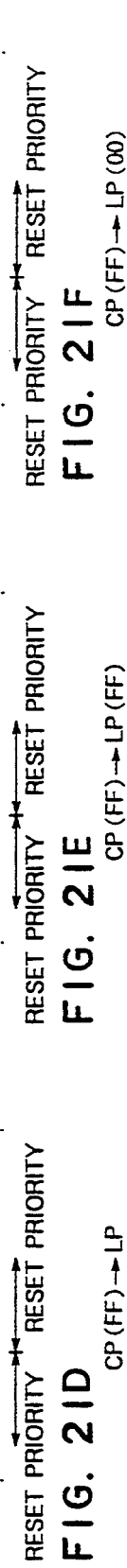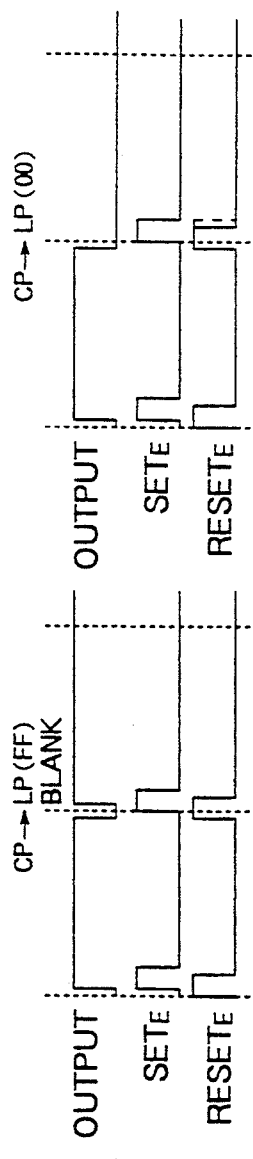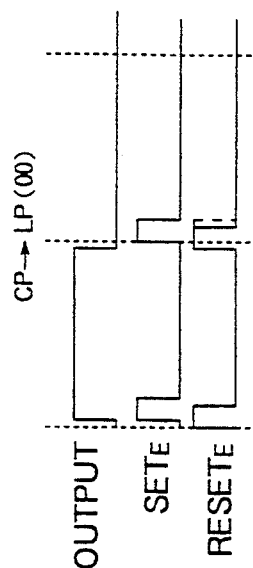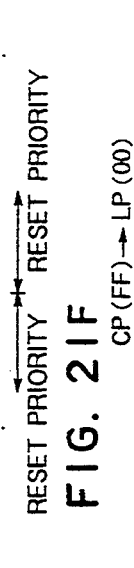

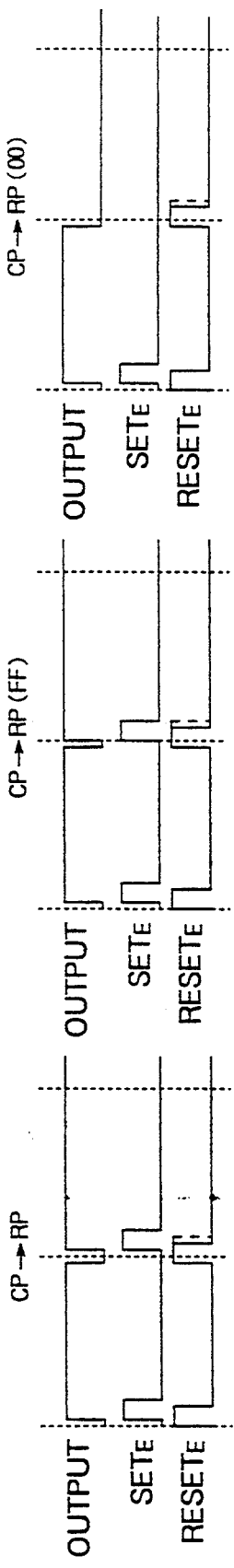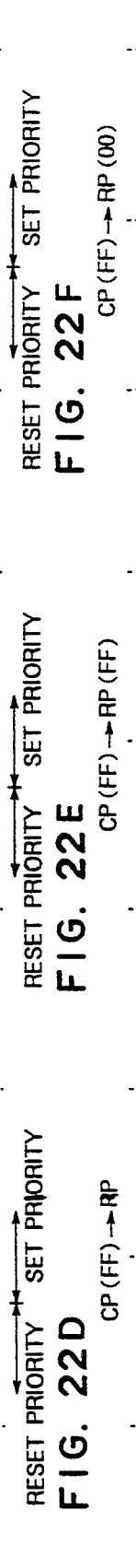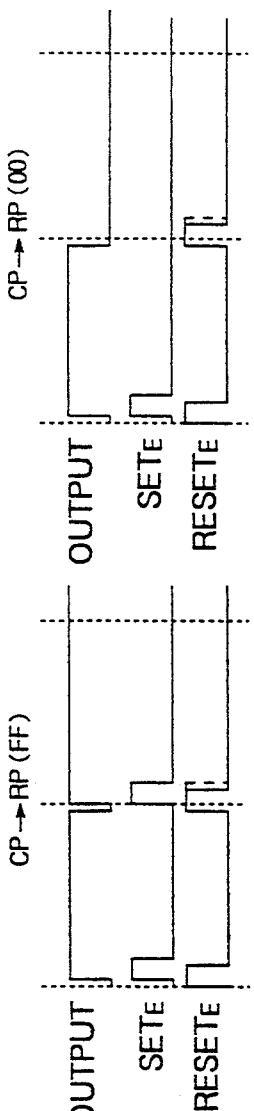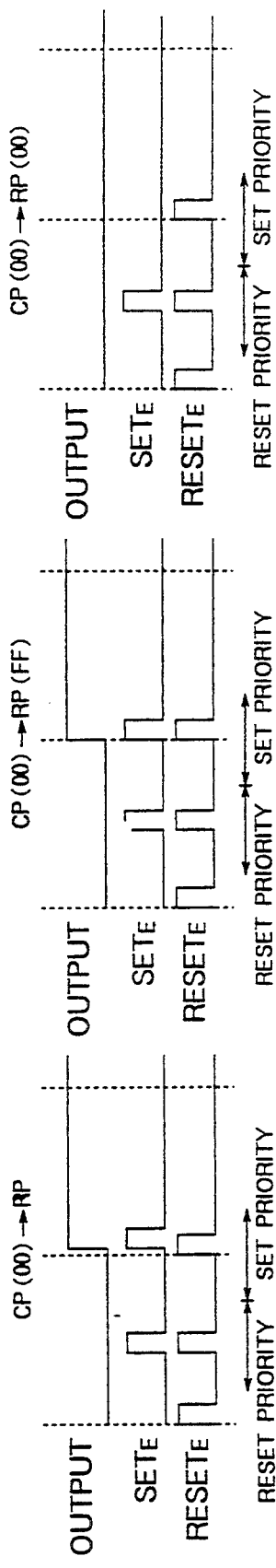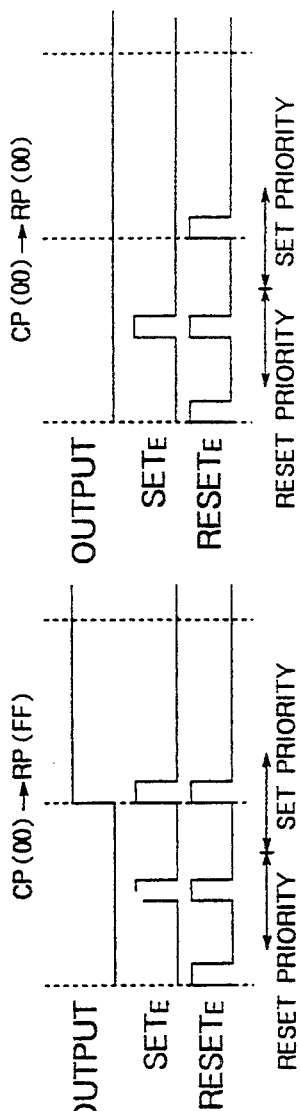

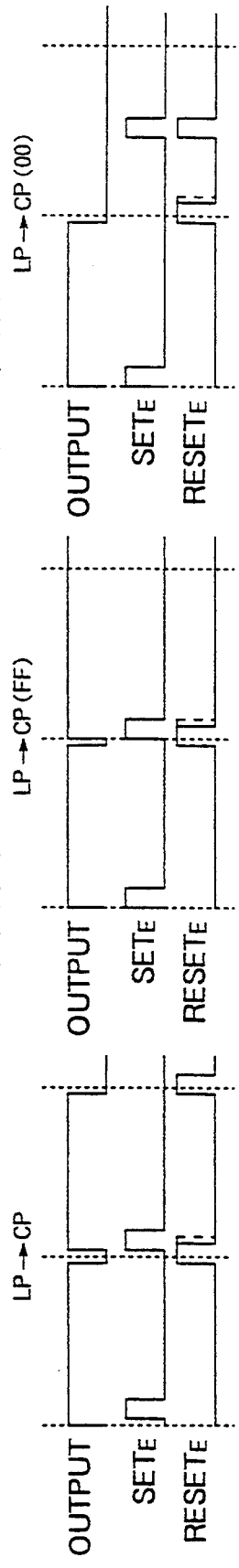
FIG. 23A LP→CP
FIG. 23B LP→CP (FF)
FIG. 23C LP→CP (00)
FIG. 23D LP (FF)→CP
FIG. 23E LP (FF)→CP (FF)
FIG. 23F LP (FF)→CP (00)
FIG. 23G LP (00)→CP
FIG. 23H LP (00)→CP (FF)
FIG. 23I LP (00)→CP (00)

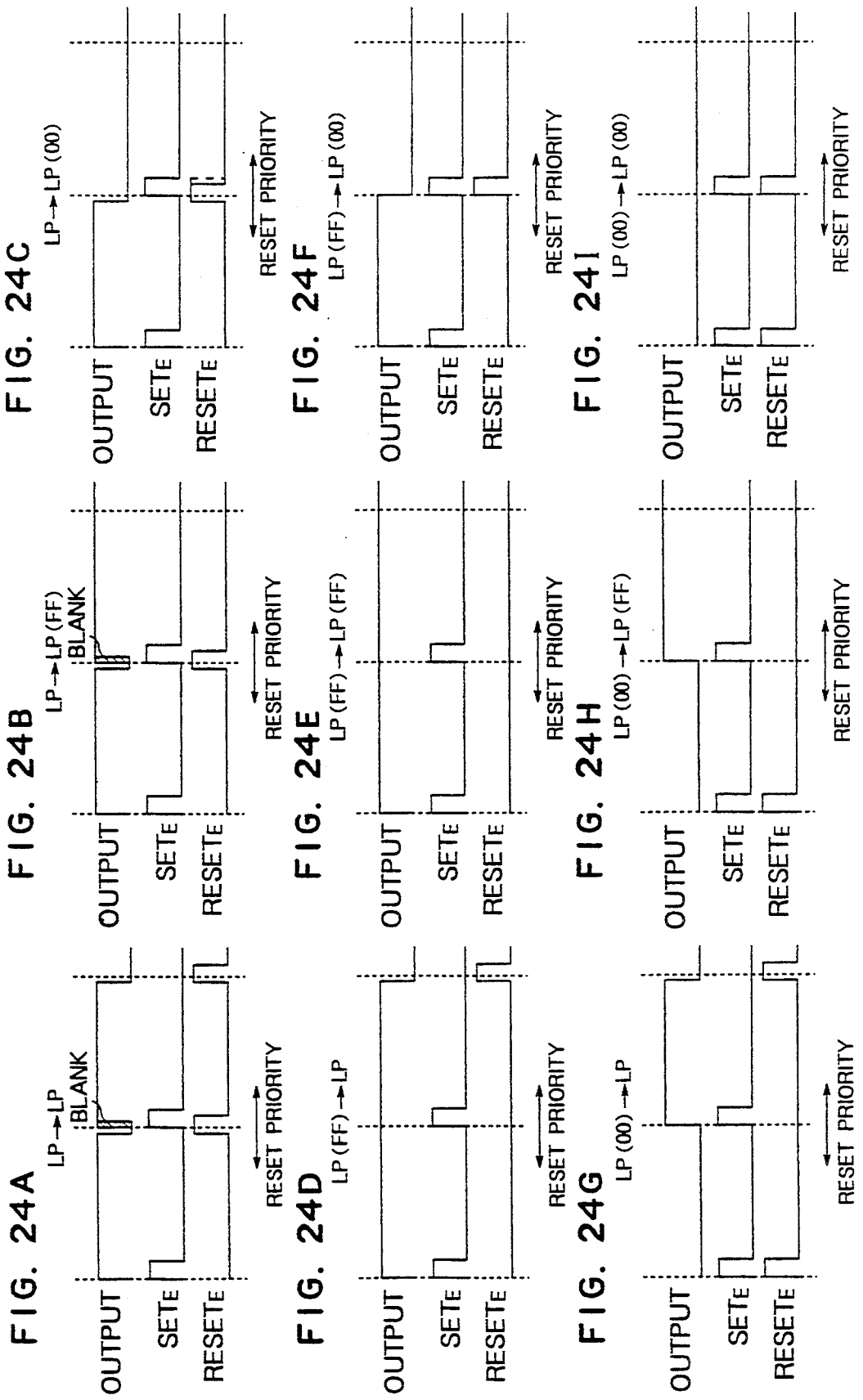

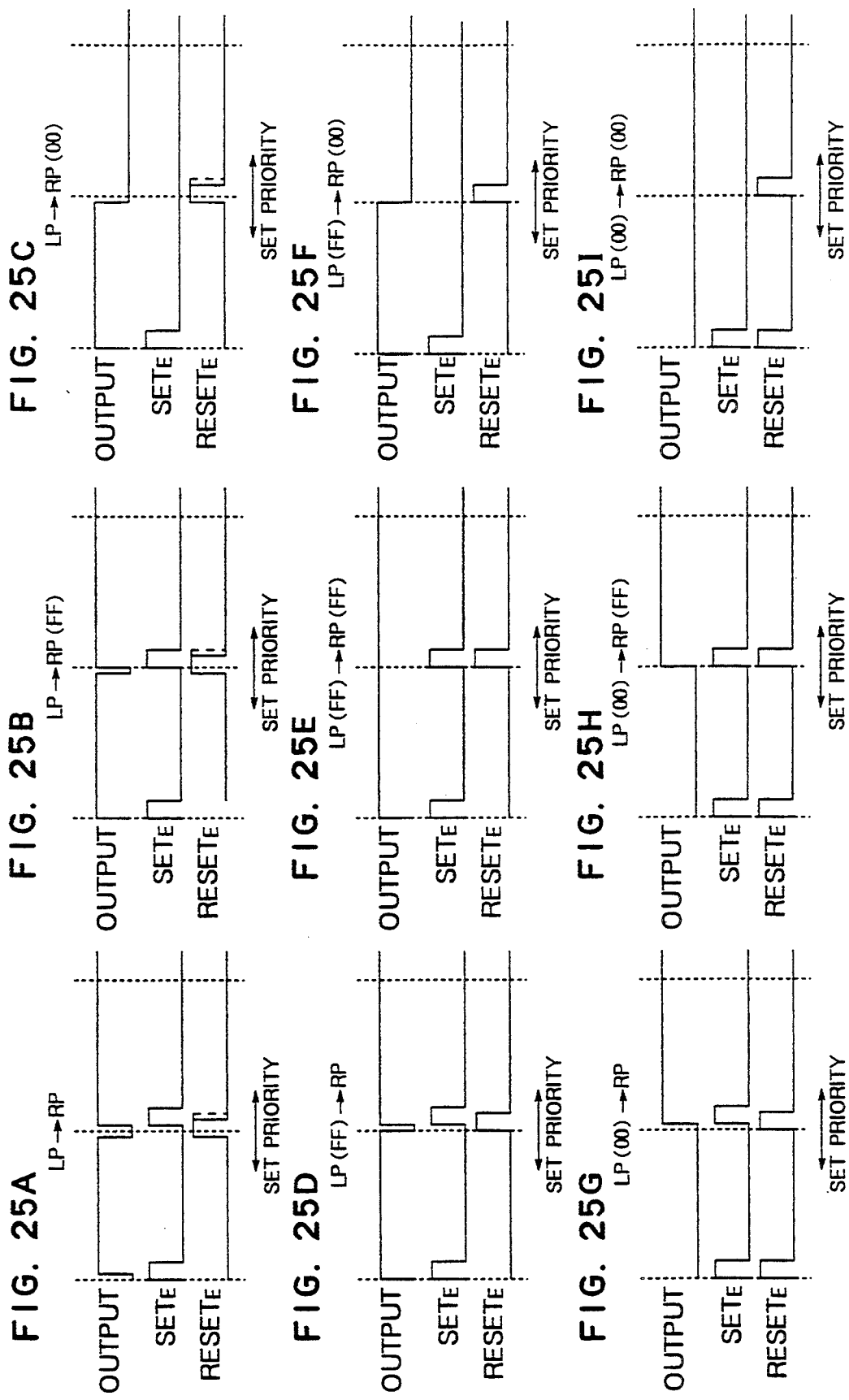

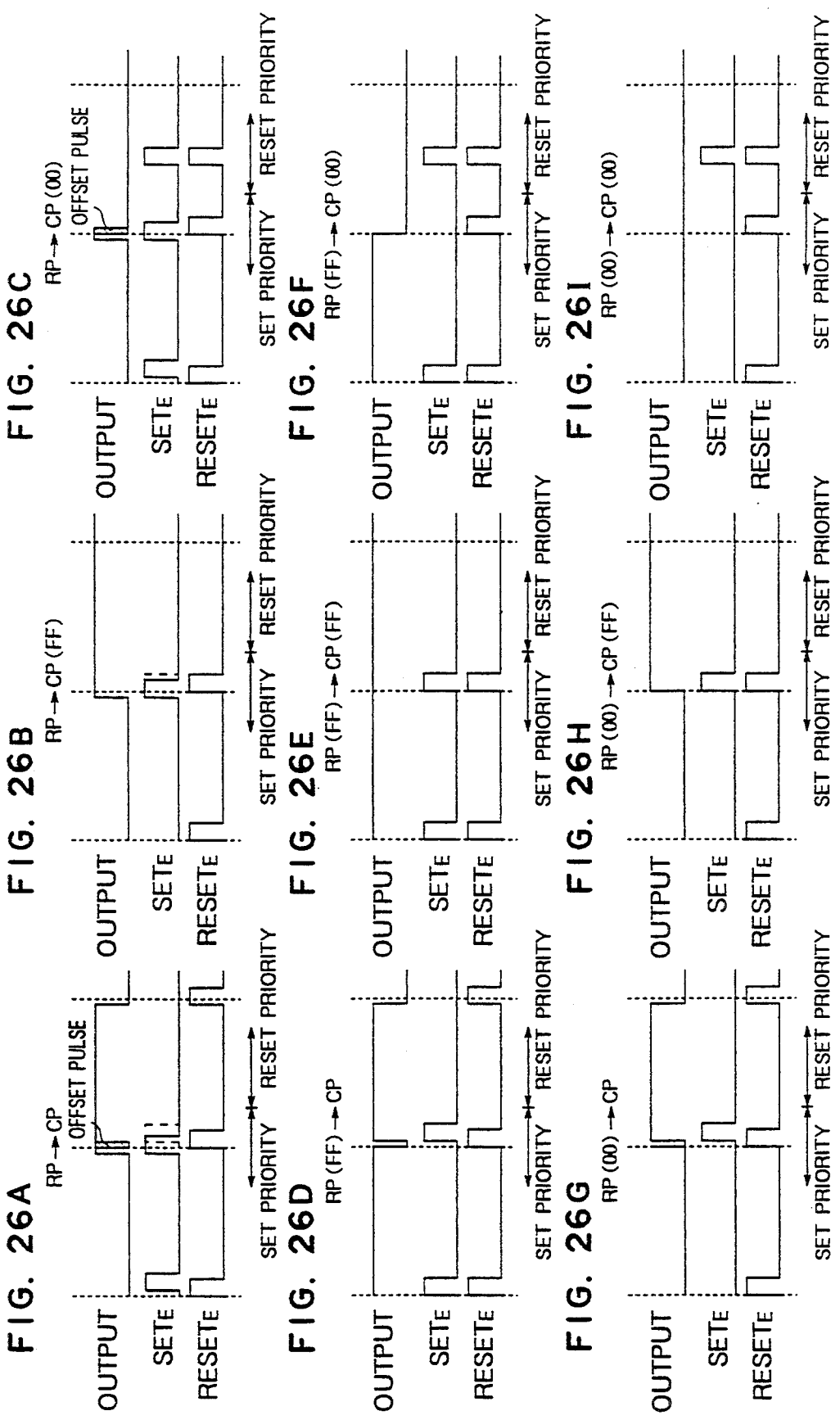

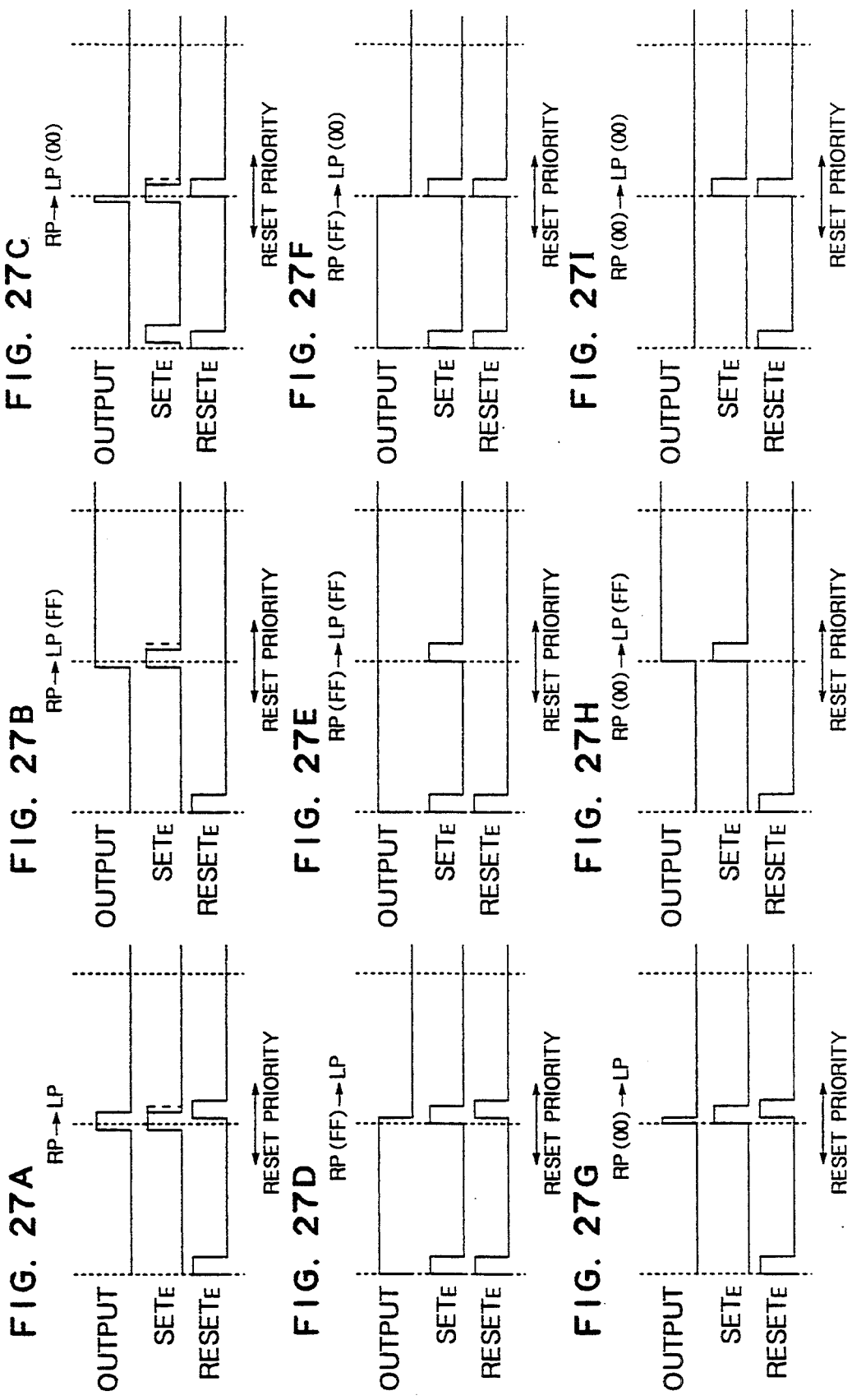

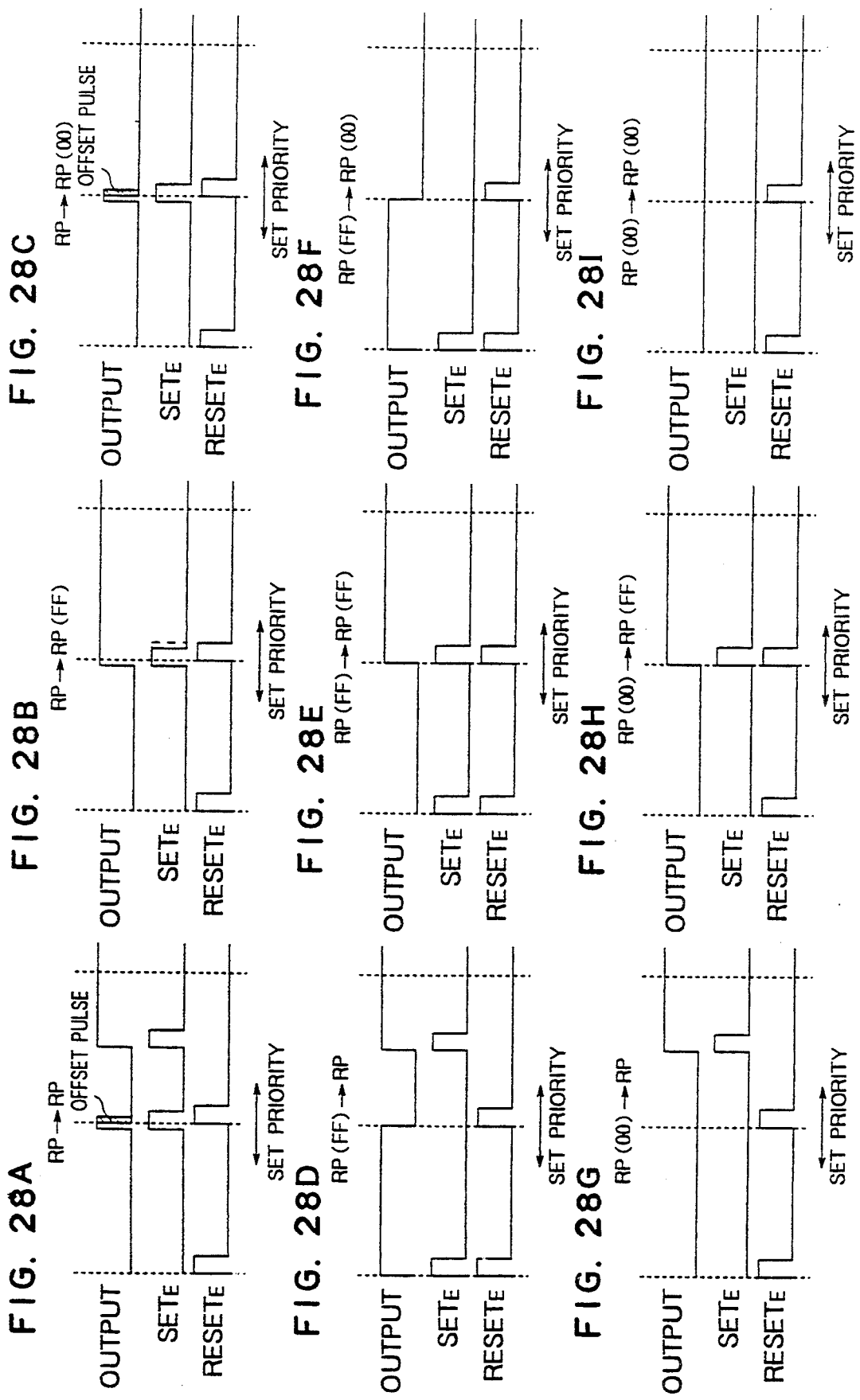

PULSE WIDTH MODULATOR HAVING CONTROLLED DELAY CIRCUIT

BACKGROUND OF THE INVENTION

1. Field of the Invention

The present invention relates to a pulse width modulation circuit (PWM) apparatus applied to for example a laser pulse generation circuit of a laser beam printer etc. which prints for example characters and graphics by changing the pulse width of a laser pulse.

2. Description of the Related Art

Today, laser beam printers are becoming increasingly important as they are printing apparatuses which can print characters and graphics with a high quality and at a high speed.

In a laser beam printer, the output information indicating characters or graphic is written on a photoconductive drum as a latent image by a laser beam. This latent image written on the photoconductive drum is printed by an electronic photographic system. For this reason, the technique of controlling the width of the pulse of the laser beam based upon the information to be printed has become one of the most important techniques for realizing a laser beam printer.

Conventionally, various pulse width modulation (PWM) circuits have been proposed as such a means for controlling the pulse width of a laser beam.

The assignee of this application previously proposed a circuit in Japanese Patent Application No. 4-210819 filed on Jul. 14, 1992, and published on Feb. 10, 1994 as Japanese Patent Publication (Kokai) No. 6-37608. The circuit generates an output pulse using a so-called reset-set type flip-flop (hereinafter referred to as an "RS-FF"). This pulse width modulation (PWM) circuit is constituted so as to be able to produce an output pulse rising or falling at any timing, and therefore it generates the set pulse and reset pulse to be supplied to the RS-FF by programmable delay circuits.

However, in this pulse width modulation circuit, the delay time of the delay gates constituting the programmable delay circuits will fluctuate due to manufacturing variations of the semiconductor integrated circuits, the environment when used, the operation temperature and the power source voltage, etc. The details will be described below.

When the delay time per stage of the delay gates becomes long, the delay time of the whole group of delay gates, which should coincide with the period of the clock pulse, becomes longer than the period of the clock pulse. As a result, even if the pulse width set up data is given so that the pulse width of the output pulse becomes slightly shorter than the maximum value, the pulse width of the actual pulse becomes longer than the ideal pulse width, or when the reset pulse is output, the set pulse of the next period is output, and so the RS-FF circuit would become unstable in state.

Contrary to this, when the delay time per stage of the delay gates becomes short, the pulse width of the output pulse becomes shorter relative to the ideal pulse width, and an empty period is produced in the pulse width, which originally should be formed over two clock periods, resulting in the fact that it becomes impossible to stably express gradations. Also, the delay times of the respective delay gates cannot be adjusted once the circuit is produced, and therefore it is also not possible to adjust the pulse width, so the circuit can only be used with a predetermined clock period.

To solve these disadvantages, the assignee of this application has proposed a pulse width modulation circuit in Japanese Patent Application No. 4-361516, filed on Dec. 29, 1992. This PWM circuit is provided with a delay time control circuit for controlling the unit delay time per stage of the delay gates based on the deviation of the phase relationship between a delay pulse, which is input from a delay gate positioned at a predetermined stage of a plurality of stages of delay gates constituting a timing generating delay circuit generating the rising and falling timings of the output pulse by inputting a set pulse and a reset pulse to a set input end and reset input end of the RS-FF circuit, and a clock pulse, which is input to the related timing generating delay circuit.

This PWM circuit has an advantage that the delay time can be controlled so as to become short where the unit delay time per stage of the delay gates has become long or to become long where the unit delay time has become short, so that stable operation not affected by manufacturing variations, the environment of use, etc. can be realized.

In this PWM circuit, however, when a clock having a period of $\frac{1}{2}$ of the delay time of the whole delay line is input, that is, where a frequency two times larger than the clock which has been input is input, ideally it is necessary to perform feedback in a direction of decreasing the delay value, but in actuality the feedback is carried out in a direction increasing the delay value. Namely, there is a disadvantage in that the range of the operation frequency of the circuit is restricted to a range of from the minimum operation frequency to two times or lower of the minimum operation frequency.

Also, generally, a laser beam printer provides a plurality of resolutions. When an input clock frequency for a plurality of resolutions changes two times or more, a single pulse width modulation circuit can not provide the plurality of resolutions. Accordingly, so as to provide the plurality of resolution so that the clock frequency may change to two times or more, a plurality of pulse width modulation circuits must be used, and there is a disadvantage that an increase of cost is induced.

Returning to the above-mentioned pulse width modulation circuit using an RS-FF, where the pulse width modulation circuit is used for a digital copying machine or laser beam printer, when it is intended to more precisely reproduce gradations, the following disadvantage occurs in a case where an output pulse narrower than the pulse width of the control pulse is generated or two successive output pulses are generated via a slight gap.

When it is intended to generate an output pulse narrower than the pulse width of the set pulse and reset pulse to be input to the RS-FF circuit, the periods in which the set pulse and reset pulse become the high level "H" overlap, and the RS-FF circuit does not normally operate. Also, when it is intended to successively generate output pulses having a wide width, periods in which the set pulse and reset pulse become the high level "H" overlap at a connection part of the current pulse period and next pulse period, and the RS-FF circuit does not normally operate. As a result, the image quality is low at the connection part of two output pulses.

To solve these disadvantages, the assignee of the application has proposed a pulse width modulation circuit in Japanese Patent Application No. 4-360286, filed on Dec. 29, 1992. This PWM circuit is constituted in that provision is made of a priority order of the set pulse and reset pulse for controlling the RS-FF circuit generating the output pulses so that they become almost symmetrical to each other relative to the center of the pulse period and in that the priority order is changed while dividing the same to those near the center of the pulse period and those in the regions other than this, whereby the output pulse raised by the set pulse falls by the reset pulse immediately after this, and the output pulse immediately after the falling by the reset pulse rises by the set pulse immediately after this.

This PWM circuit has an advantage that an output pulse narrower than the control pulse can be generated, the RS-FF circuit normally operates, and the deterioration of the image quality can be prevented.

In the related art as shown in FIG. 1, there is therefore provided a pulse width modulation circuit which delays a control pulse CLKP input at every predetermined period by an arbitrary time via time delay means 3 and 4, inputs the delayed control pulses S1 and S2 to a set input terminal and reset input terminal of a latch means (RS-FF) 5, respectively, and modulates the pulse width of the output pulse $PWM_{OUT}$ output from a latch means (RS-FF) based on the control pulses S1 and S2 input to the set input terminal and reset input terminal; wherein a latch means (RS-FF) 5 is provided with a set pulse priority mode (S6="L"), giving a priority to the control pulse S1 input to the set input end with respect to the control pulse S2 input to the reset input end for a predetermined period in the predetermined period, and a reset pulse priority mode (S6="H"), giving a priority to the control pulse S2 input to the reset input end with respect to the control pulse S1 input to the set input end for a period other than the predetermined period in the predetermined period T.

Also, there is provided a pulse width modulation circuit which delays a control pulse CLKP input at every predetermined period by an arbitrary time via time delay means 3 and 4, inputs the delayed control pulses S1 and S2 to a set input terminal and reset input terminal of a latch means 5, respectively, and modulates the pulse width of the output pulse $PWM_{OUT}$ output from the latch means 5 based on the control pulses S1 and S2 input to the set input terminal and reset input terminal, wherein the time delay means 3 and 4 comprise a first and second delay gate groups 3 and 4 respectively corresponding to two periods corresponding to a former half and latter half of the predetermined period T; the control pulse S1 delayed by an arbitrary time by the first delay gate group 3 is output as the set pulse to the set input terminal of the latch means 5 and the control pulse S2 delayed by an arbitrary time by the second delay gate group 4 is output as the reset pulse to the reset input terminal of the latch means 5; the latch means 5 is changed over to the set pulse priority mode (S6 ="L") or the reset pulse priority mode (S6="H") by the mode switching signal S6; and the mode switching signal S6 is changed over to the reset pulse priority mode by the control pulse S5A output from the predetermined position (T/4) among a plurality of stages of delay elements constituting the first delay gate group 3 and changed over to the set pulse priority mode by the control pulse S4A output from the predetermined position (3T/4) among a plurality of stages of time delay elements constituting the second delay gate group FIGS. 5A to 8I are waveform diagrams showing an output pulse in a combination of pulse modes of this pulse width modulation circuit.

In the FIGURES, CP (center pulse), LP (left pulse), and RP (right pulse) are pulse modes expressing the center, leftward mode, and rightward mode, respectively.

FIGS. 2A to 2C are graphs of pulse widths of the CP mode at 0% PWM, 50% PWM and 100% PWM, respectively. FIGS. 3A to 3C are graphs of pulse widths of the LP mode at 0% PWM, 50% PWM and 100% PWM, respectively. FIGS. 4A to 4C are graphs of pulse widths of the RP mode at 0% PWM, 50% PWM and 100% PWM, respectively.

A gradation is expressed by the combination of the size of dots and position of dots. In general, there are 32 to 256 (5 bits to 8 bits) sizes of the dots and three types of positions of the center, leftward, and rightward mentioned above with respect to the pulse period. By combining these modes, the printing of characters, graphics, etc. is carried out.

Also, CP (00), LP (00), and RP (00) express a case where the 8 bits of pulse width set up data PWD are all "0" and a so-called 0 percent (%) pulse output is carried out, and CP (FF), LP (FF), and RP (FF) express a case where the 8 bits of pulse width set up data PWD are all "1" and so-called 100 percent (%) pulse output is carried out. Note that the above-described "00" and "FF" indicate the data expressed by hexadecimal notation. Below, the pulse width set up data PWD will be similarly expressed by the hexadecimal notation.

In this circuit, however, due to the priority mode of the reset (RESET) and set (SET) of the RS-FF circuit, at the time when CP is moved to LP in FIG. 5 and at the time when LP is moved to LP in FIG. 6, in a period indicated by hatching in the figure, a so-called blank pulse where no pulse is generated irrespective of the fact it is a period for which the pulse must be generated is generated by ten combination pulse modes.

Similarly, at the time when RP is moved to CP in FIG. 7 and at the time when RP is moved to RP in FIG. 8, in a period indicated by hatching in the figure, a so-called offset pulse state, where a pulse is generated irrespective of the fact it is a period for which a pulse should not be generated, is generated by eight combination pulse modes.

In a digital copying machine (DPPC) and laser beam printer (LBP), the existence of the above-mentioned blank pulse and offset pulse does not become a disadvantage in general use, but exerts an adverse influence when trying to express more precise gradations.

Particularly an offset pulse generated at the time of a 0 percent (%) pulse setting, that is, at the time of non-output of a pulse, is a disadvantage, and a phenomenon occurs of dots being printed in a nonprinting part.

SUMMARY OF THE INVENTION

So as to overcome the above-described disadvantages, according to a first aspect of the present invention, there is provided a pulse width modulation circuit which delays a control pulse input at every predetermined period by an arbitrary time via delay means, inputs the control pulses to a set input terminal and reset input terminal of a latch means, respectively, and modulates the pulse width of the output pulse output from the latch means based on the control pulses input to the set input terminal and reset input terminal, which is further provided with a means which makes the above-described control pulses pass through the above-described delay means by exactly a predetermined number of times in accordance with the operation frequency and generates the input timing to the set input terminal and reset input terminal of the above-described latch means of the control pulse.

According to the present invention, since the input control pulse is made to pass through the delay means exactly by a predetermined number of times in accordance with the operation frequency, the input timings to the set input terminal and reset input terminal in the latch means of the control pulses, that is, rising and falling timings of the output pulse, are generated.

Due to this, even at a lower frequency, the timing for pulse generation can be easily generated.

According to a second aspect of the present invention, there is provided a pulse width modulation circuit capable of varying the timing of the pulse output in accordance with the set up data, which delays a control pulse input at every predetermined period by an arbitrary time via delay means, inputs the control pulses to a set input end and reset input end of a latch means, respectively, and modulates the pulse width of the output pulse output from the latch means based on the control pulses input to the set input terminal and reset input terminal, wherein provision is further made of a pulse input control means which controls the input of the control pulses to the set input terminal and reset input terminal of the above-described latch means in accordance with the set up mode.

Also, in the present invention, the above-described input control means performs the above-described input control at the time of full pulse output where it outputs the pulses over the full period of one period of the control pulses and at the time of non-pulse output where it stops the output of pulses over the entire period.

Also, in the present invention, provision is made of a pulse shaping means which makes the pulse width of the above-described control pulse narrower by dividing it into a plurality of stages.

According to the present invention, as mentioned above, since the input of the control pulse to the set input terminal and reset input terminal of the latch means is controlled in accordance with the set up mode, particularly, since this input control is carried out at the time of full pulse output wherein the pulses are output over the full period of one period of the control pulses and at the time of non-pulse output where the output of pulses is stopped over the entire period, the pulse width of the output pulse output from the latch means is modulated based on the control pulses input to the set input terminal and the reset input terminal and, also, the output timing of the pulse is set to a desired timing in accordance with the set up mode.

Also, according to the present invention, since the pulse width of the control pulse is made narrower by the pulse shaping means by dividing it into a plurality of stages and input to the set input terminal and the reset input terminal of the latch means, it is possible to suppress the blank pulse and offset pulse to a degree of the minimum pulse width that the latch means can operate with.

BRIEF DESCRIPTION OF THE DRAWINGS

The above and other objects and features of the present invention will be described in more detail with reference to the accompanying drawings, in which:

FIGS. 2A to 2C are graphs of pulse widths of the CP mode at 0% PWM, 50% PWM and 100% PWM, respectively;

FIGS. 3A to 3C are graphs of pulse widths of the LP mode at 0% PWM, 50% PWM and 100% PWM, respectively;

FIGS. 4A to 4C are graphs of pulse widths of the RP mode at 0% PWM, 50% PWM and 100% PWM, respectively;

FIGS. 5A to 5I are timing charts showing an output waveform of the pulse width modulation circuit of the related art shown in FIG. 1;

FIGS. 6A to 6I are timing charts showing another output waveform of the pulse width modulation circuit shown in FIG. 1;

FIGS. 7A to 7I are timing charts showing still another output waveform of the pulse width modulation circuit shown in FIG. 1;

FIGS. 8A to 8I are timing charts showing yet another output waveform of the pulse width modulation circuit shown in FIG. 1;

FIG. 16 is a view for explaining the operation of a shift register of the pulse width modulation circuit of the present invention shown in FIG. 15;

FIGS. 18A to 18L are timing charts for explaining the operation of the pulse width modulation circuit of the present invention shown in FIG. 17;

FIGS. 20A to 20I are timing charts for explaining still another operation of the pulse width modulation circuit of the present invention shown in FIG. 17;

FIGS. 21A to 21I are timing charts for explaining yet another operation of the pulse width modulation circuit of the present invention shown in FIG. 17;

FIGS. 22A to 22I are also timing charts for explaining another operation of the pulse width modulation circuit of the present invention shown in FIG. 17;

FIGS. 23A to 23I are also timing charts for explaining still another operation of the pulse width modulation circuit of the present invention shown in FIG. 17;

FIGS. 24A to 24I are also timing charts for explaining yet another operation of the pulse width modulation circuit of the present invention shown in FIG. 17;

FIGS. 25A to 25I are further timing charts for explaining another operation of the pulse width modulation circuit of the present invention shown in FIG. 17;

FIGS. 26A to 26I are further timing charts for explaining still another operation of the pulse width modulation circuit of the present invention shown in FIG. 17;

FIGS. 27A to 27I are further timing charts for explaining yet another operation of the pulse width modulation circuit of the present invention shown in FIG. 17; and FIGS. 28A to 28I are further timing charts for explaining another operation of the pulse width modulation circuit of the present invention shown in FIG. 17.

DESCRIPTION OF THE PREFERRED EMBODIMENTS

Embodiments of the present invention will be explained in detail below with reference to the drawings.

Figure 9:
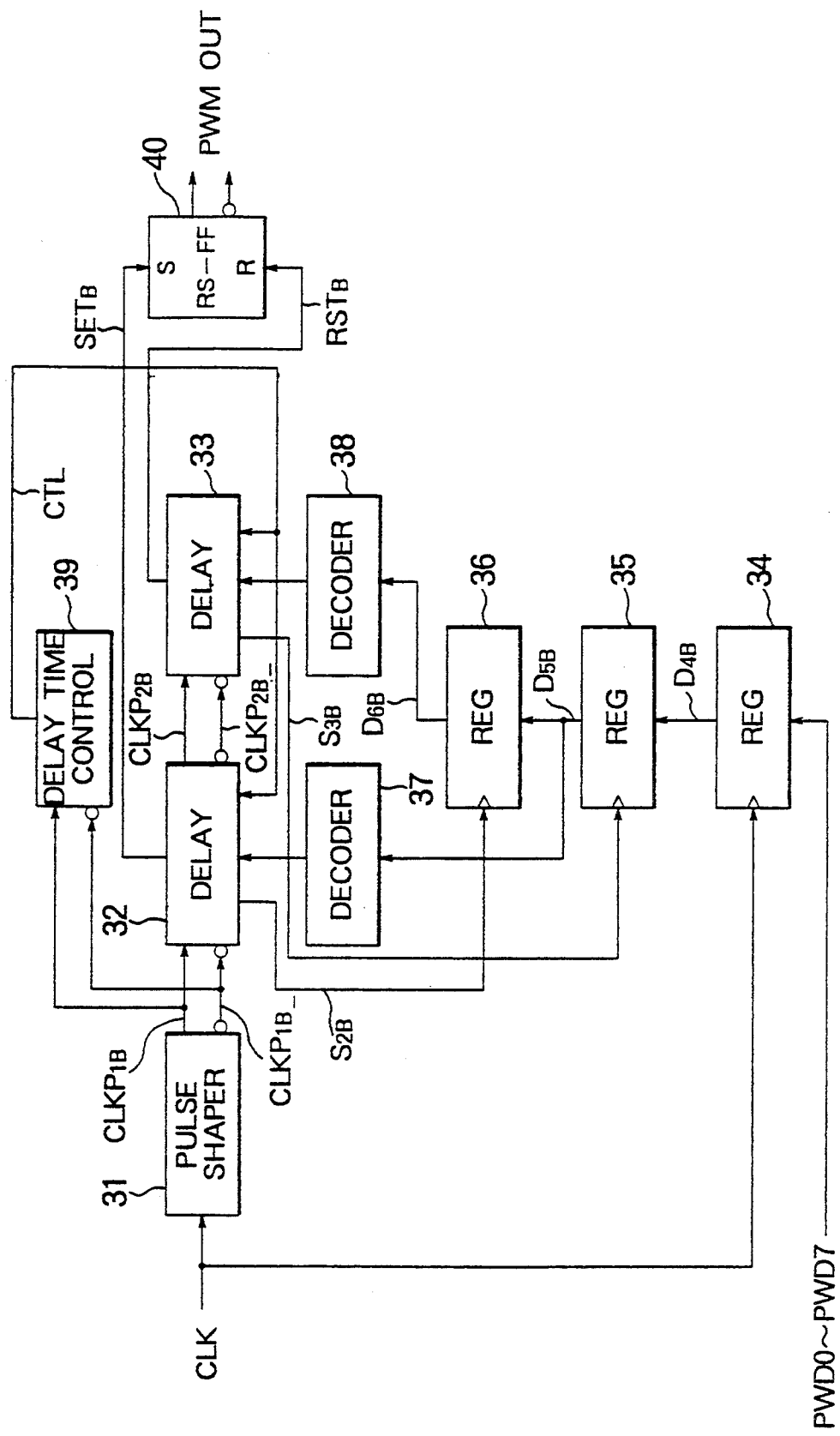
FIG. 9 is a block diagram of a pulse width modulation circuit of a first embodiment of the present invention.
Figure 10:
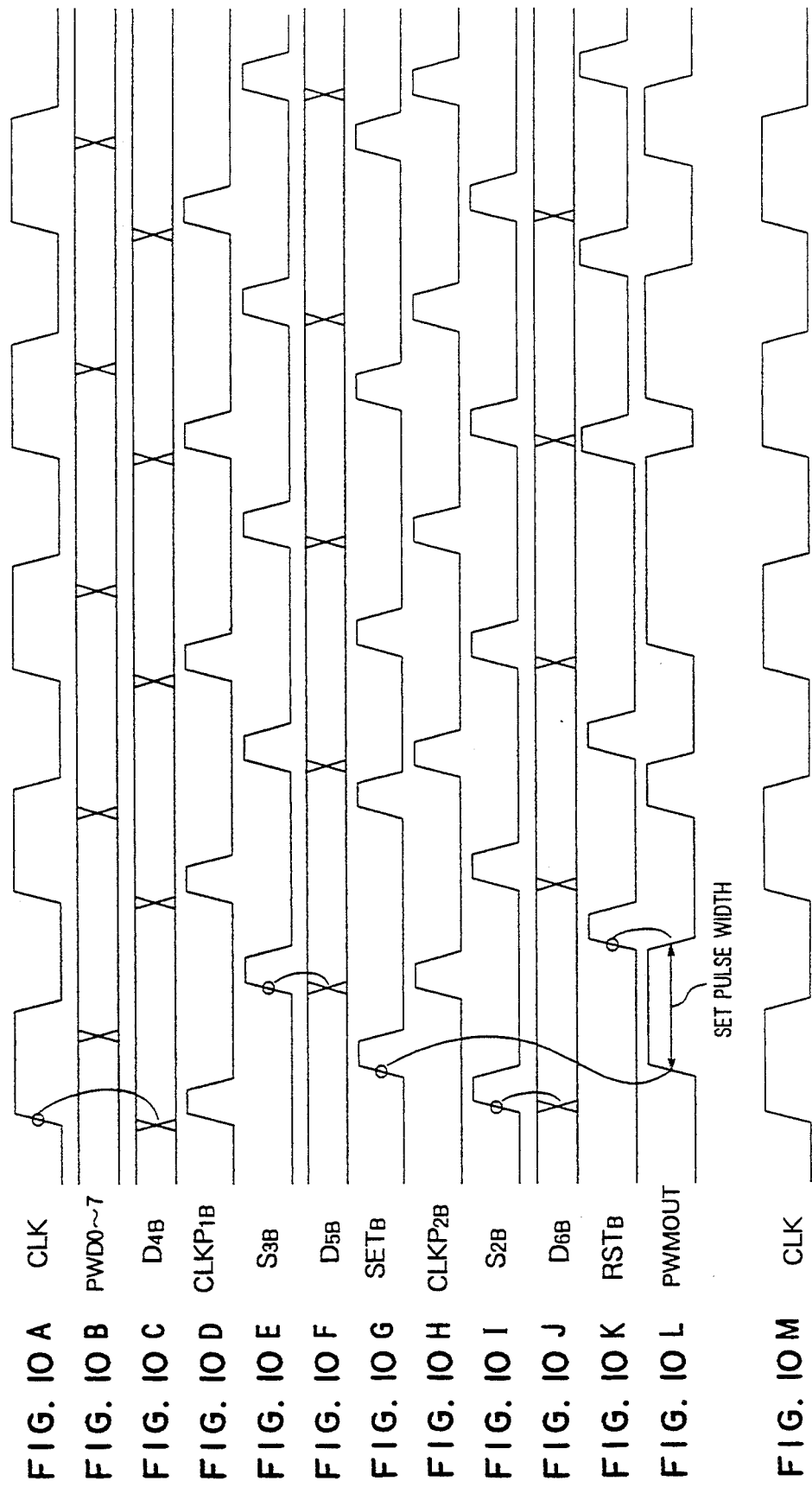
FIGS. 10A to 10M are timing charts for explaining the operation of the pulse width modulation circuit of the present invention shown in FIG. 9.

FIG. 9 is a block diagram showing a first embodiment of a pulse width modulation circuit according to the present invention; and FIGS. 10A to 10M are timing charts showing an input/output waveform in respective portions of FIG. 9.

In FIG. 9, 31 denotes a pulse shaper; 32, a first programmable delay circuit (hereinafter referred to as a delay circuit); 33, a second programmable delay circuit; 34, a first register; 35, a second register; 36, a third register; 37, a first decoder; 38, a second decoder; 39, a delay time control circuit; and 40, an RS-FF circuit; respectively.

The pulse shaper 31 receives an original input clock signal CLK having a frequency of several tens MHz, for example 20 MHz to 40 MHz, converts the same to complementary clock pulses $CLKP_{1B}$ and $CLKP_{1B-}$ having a fine pulse width based on the rising edge of the input clock signal CLK, and outputs them to the first delay circuit 32 and delay time control circuit 39. The clock pulse $CLKP_{1B-}$ has an inverted polarity of that of the clock pulse $CLKP_{1B}$. The pulse shaper 31 converts the input clock signal CLK to the clock pulses $CLKP_{1B}$ and $CLKP_{1B-}$, each having a pulse width which can sufficiently pass the first and second delay circuits 32 and 33 and enough to generate the pulse at the last stage RS-FF circuit 40.

Figure 11:
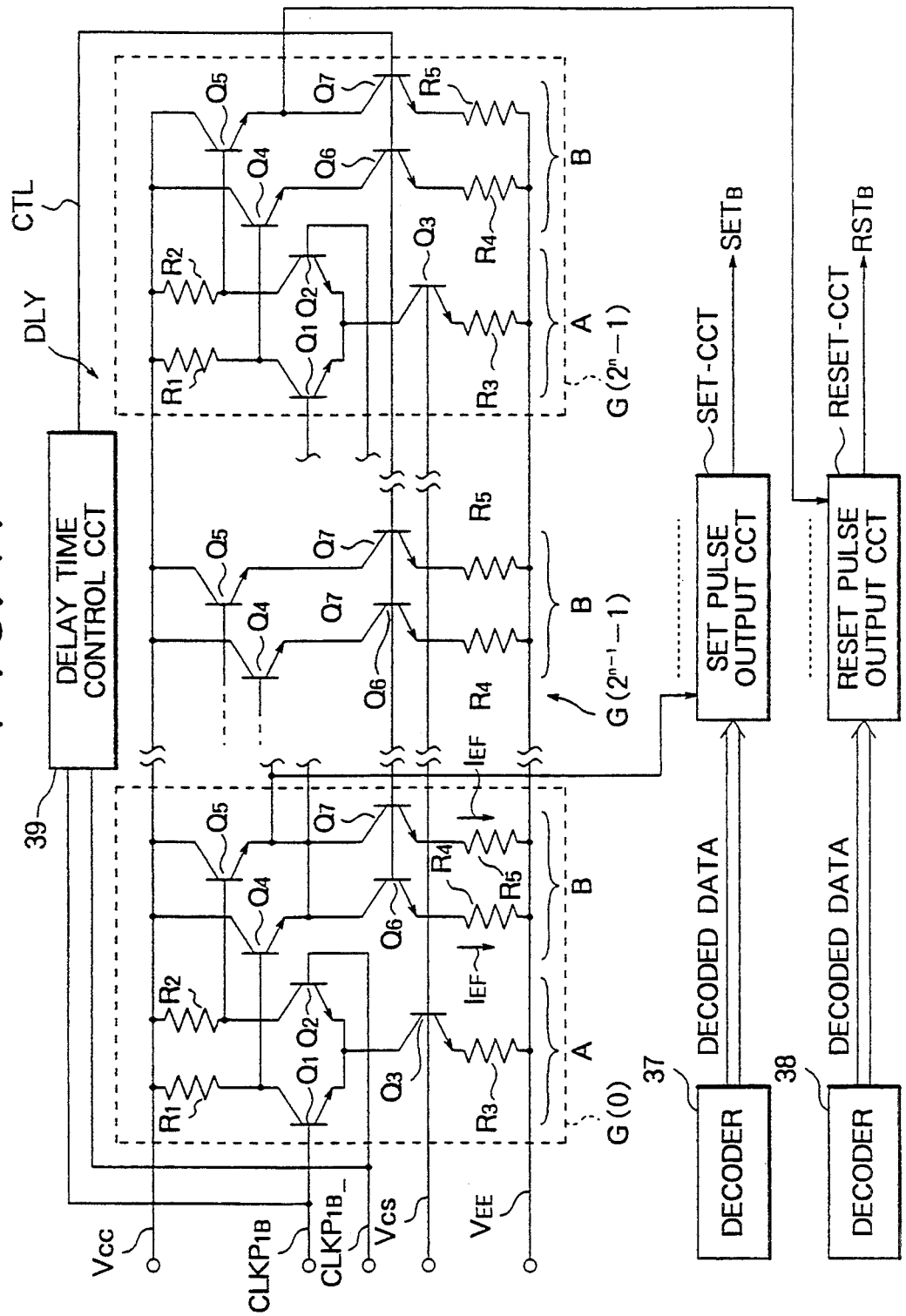
FIG. 11 is a concrete circuit diagram of the pulse width modulation circuit of a second embodiment of the present invention.

Note that the input clock signal CLK is used as a periodic reference pulse signal having a pulse width defining a period as shown in FIG. 2A. When the frequency of the input clock signal CLK is for example 20 MHz, the period is 1/20 MHz=0.05 μs=50 ns. Namely, one period of this example is very short. The complementary clock pulses $CLKP_{1B}$ and $CLKP_{1B-}$ are used as internal pulses for generating a set pulse $SET_B$ and a reset pulse $RST_B$ at the delay circuits 32 and 33. Therefore, a pulse width of the complementary clock pulses $CLKP_{1B}$ and $CLKP_{1B-}$ should be as narrow as much as possible and should be to sufficient to pass them through the delay circuits 32 and 33. As seen in FIG. 11, preferably, the delay circuits 32 and 33 are formed by an emitter-coupled logic (ECL) type differential-pair circuit.

The first delay circuit 2 is constituted by a plurality of stages of delay gates which delay the clock pulse $CLKP_{1B}$ output from the pulse shaper 31 and the inversion pulse $CLKP_{1B-}$ thereof by a predetermined delay time each and output the same [and a plurality of selection gates respectively corresponding to the delay gates and connected in series]. The first delay circuit 2 outputs the set pulse $SET_B$ to a set signal input terminal S of the RS-FF circuit 40 at a timing set by the pulse width set up data PWD, and outputs complementary clock pulses $CLK_{2B}$ and $CLKP_{2B-}$, which are the complementary clock pluses $CLKP_{1B}$ and $CLKP_{1B-}$ delayed by a predetermined delay time, to the second delay circuit 33. The timing of $SET_B$ through the first delay circuit 2 is determined by the delay time control circuit 39. Also, the first delay circuit 32 outputs a read-in allowing signal $S_{2B}$ to the third register 36 when the clock pulse $CLKP_{1B}$ passes the delay gate stage positioned at substantially the center.

The second delay circuit 33 is constituted by a plurality of stages of delay gates which delay the clock pulses $CLKP_{2B}$ and $CLKP_{2B-}$ output from the first delay circuit 32 by a predetermined delay time each and output the same The second delay circuit 33 outputs the reset pulse $RST_B$ to a reset signal input terminal R of the RS-FF circuit 40 at a timing set by the pulse width set up data PWD. Also, the second delay circuit 33 outputs a read-in allowing signal $S_{3B}$ to the second register 35 when the clock pulse $CLKP_{2B}$ passes the delay gate stage positioned at substantially the center. The timing of $RST_B$ through the second delay circuit 33 is determined by the delay time control circuit 39.

These first and second delay circuits 32 and 33 are connected in series and input as a whole the set pulse $SET_B$ and reset pulse $RST_B$ to the set signal input terminal S and the reset signal input terminal R of the RS-FF circuit 40, thereby functioning as the timing generating delay circuit DLY generating the rising and falling timings of the output pulse $PWM_{OUT}$.

FIG. 11 is a concrete circuit diagram showing an example of the delay circuits 32 and 33 of a second embodiment of the present invention.

As shown in FIG. 11, the delay circuit DLY is constituted by a plurality of delay gates G (0) to G ($2^n-1$) connected in series, each gate comprising a differential input stage A and an emitter-follower output stage B. The differential input stage A of each delay gate G is constituted by an ECL differential-pair circuit of npn-type transistors $Q_1$ to $Q_3$ and resistor elements $R_1$ to $R_3$. The emitter-follower output stage B is constituted by npn-type transistors $Q_4$ to $Q_7$ and resistor elements $R_4$ and $R_5$. These stages A and B are specifically connected as follows.

Emitters of the transistors $Q_1$ and $Q_2$ of the differential input stage A are connected to each other, the collector of the transistor $Q_1$ is connected to a line of a power source voltage $V_{CC}$ via the resistor element $R_1$, and the collector of the transistor $Q_2$ is connected to the line of the power source voltage $V_{cc}$ via the resistor element $R_2$. A point of connection between the emitters of the transistors $Q_1$ and $Q_2$ is connected to the collector of the transistor $Q_3$, and the emitter of the transistor $Q_3$ is connected via the resistor element $R_3$ to a line of a power source voltage $V_{EE}$. The bases of the transistors $Q_1$ and $Q_2$ of the differential input stages A of the delay gate G (0) at the first stage are connected to input terminals of the complementary clock pulse $CLKP_{1B}$ and $CLKP_{1B-}$. The bases of the transistors $Q_1$ and $Q_2$ of the differential input stage A of the second and subsequent stages are connected to the respective output terminals of the emitter-follower output stage B of the former stage. For example, the respective output terminals are the emitters of the transistors $Q_4$ and $Q_5$ of the emitter-follower output stage B of the delay gate G(0).

The base of the transistor $Q_3$ is connected to a line of a power source voltage $V_{CS}$. The transistor $Q_3$ and the resistor element $R_3$ forms a current source.

The collector of the transistor $Q_4$ in the emitter-follower output stage B is connected to the line of the power source voltage $V_{cc}$, the emitter thereof is connected to the collector of the transistor $Q_6$, and the base thereof is connected to a point of connection between the collector of the transistor $Q_1$ of the differential input stage A and the resistor element $R_1$. The collector of the transistor $Q_5$ is connected to the line of the power source voltage $V_{cc}$, the emitter thereof is connected to the collector of the transistor $Q_7$, and the base thereof is connected to a point of connection between the collector of the transistor $Q_2$ of the differential input stage A and the resistor element $R_2$. The emitter of the transistor $Q_6$ is connected via the resistor element $R_4$ to the line of the power source voltage $V_{EE}$. The emitter of the transistor $Q_7$ is connected via the resistor element $R_5$ to the line of the power source voltage $V_{EE}$. The transistor $Q_6$ and the resistor element $R_4$ forms a current source. Also, the transistor $Q_7$ and the resistor element $R_5$ forms a current source. Note, the bases of the transistors $Q_6$ and $Q_7$ constituting the current sources in the emitter-follower output stage B in each delay gate G are connected to the output line of the control signal CTL of the delay time control circuit 39.

In the delay circuit DLY, the change of the control signal CTL from the delay time control circuit 39 changes emitter currents $I_{EF}$ passing through the transistors $Q_6$ and $Q_7$ and changes the output time of the output signals at the collectors of the transistors $Q_6$ and $Q_7$. Namely, the delay circuit DLY delays the output time and makes the delay time longer by that amount where the bias voltage given by the control signal CTL is low, while it shortens the output time and makes the delay time shorter by that amount where the bias voltage is high.

The first register 34 fetches the 8 bits of the pulse width set up data PWD0 to PWD7 for setting the pulse width of the output pulse $PWM_{OUT}$ of the RS-FF circuit 40 at a rising timing of the input clock signal CLK and outputs the fetched data $D_{4B}$ to the second register 35.

The second register 35 fetches the pulse width set up data $D_{4B}$ held in the first register 34 when the read-in allowing signal $S_{3B}$ by the second delay circuit 33 is input and rewrites the same and outputs the same to the first decoder 37 and third register 36 corresponding to the former half period of the clock signal.

The third register 36 fetches the pulse width set up data $D_{5B}$ held in the second register 35 when the read-in allowing signal $S_{2B}$ by the first delay circuit 32 is input and rewrites the same and outputs the same to the second decoder 38 corresponding to the latter half period of the clock.

The first decoder 37 decodes a pulse width set up data $D_{5B}$ fetched into the second register 35 in the period until the complementary clock pulses $CLKP_{2B}$ and $CLKP_{2B\_}$ reach the last stage of the second delay circuit 33, sets which output of the stages of delay gates is to be selected before the clock pulses $CLKP_{1B}$ and $CLKP_{1B\_}$ corresponding to the next pulse period T are input to the first delay circuit 32, and outputs the result thereof to the first delay circuit 32.

The second decoder 38 decodes a pulse width set up data $D_{6B}$ fetched into the third register 36 in the period until the clock pulses $CLKP_{1B}$ and $CLKP_{1B\_}$ reach the last stage of the first delay circuit 32, sets which output of the stages of the delay gates is to be selected before the clock pulses $CLKP_{2B}$ and $CLKP_{2B\_}$ based on these clock pulses $CLKP_{1B}$ and $CLKP_{1B\_}$ are input to the second delay circuit 33, and outputs the result thereof to the second delay circuit 33.

Figure 12:
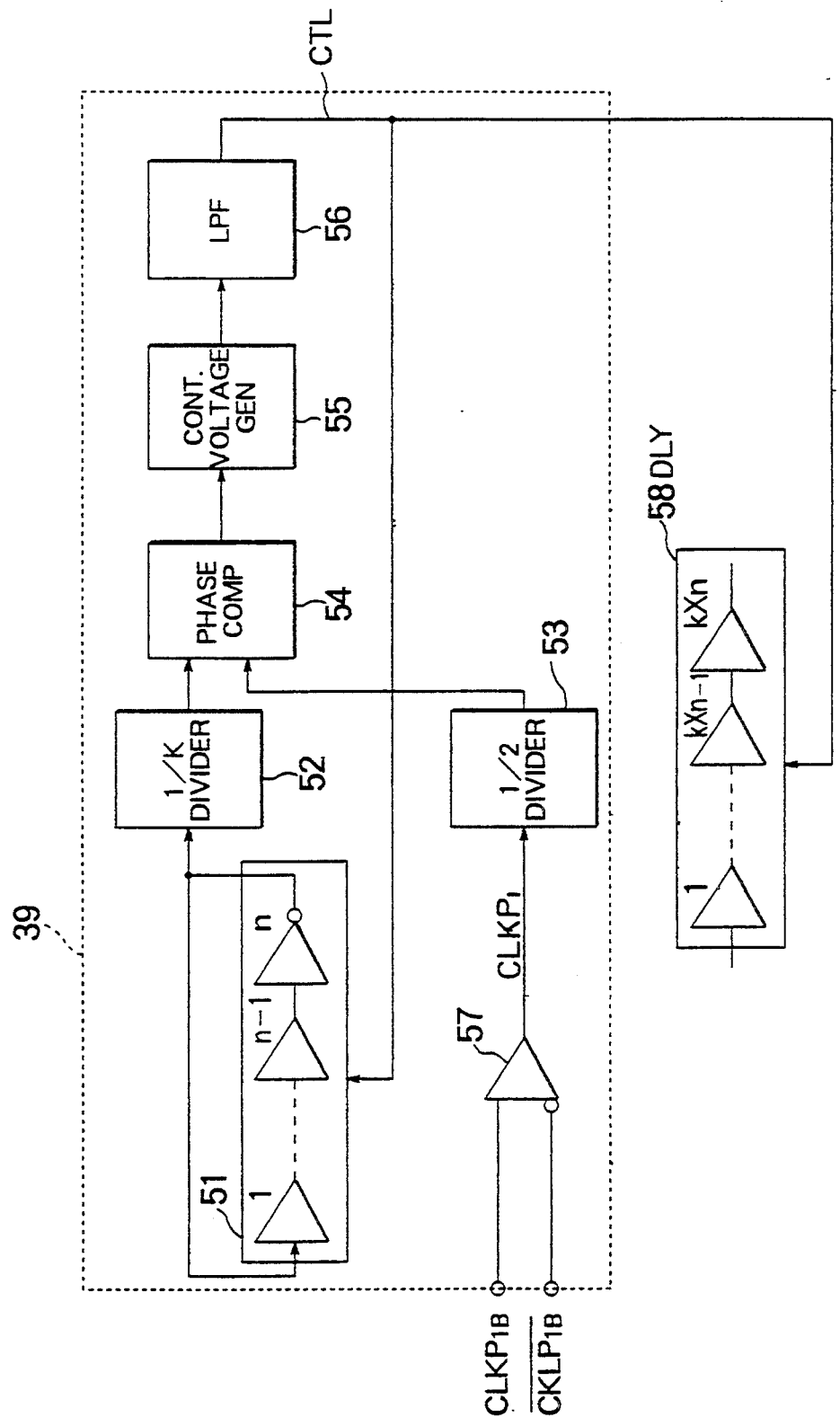
FIG. 12 is a block diagram of the pulse width modulation circuit of a third embodiment of the present invention.

FIG. 12 is a block diagram showing a concrete structural example of the delay time control circuit 39 of a third embodiment of the present invention.

The delay time control circuit 39 has a reference signal generation circuit 51 comprising a ring oscillator using delay gates having a delay time of 1/n based on the whole delay time of the delay circuit DLY comprising the first and second delay circuits 32 and 33 generating the rising and falling timings of the output pulse $PWM_{OUT}$. The circuit 39 performs a phase comparison between the signal obtained by dividing the frequency of the output signal of this reference signal generation circuit by n and the output signal obtained by dividing the frequency of the clock pulse $CLKP_1$ by 2, generates a voltage in accordance with the phase difference between the two, and feeds the same as the control signal CTL to the bases of the transistors $Q_6$ and $Q_7$ of the emitter-follower output stage B constituting each delay gate G of the first delay circuit 32 and the second delay circuit 33.

Specifically, the delay time control circuit 39 is constituted by a reference signal generation circuit 51, a k-frequency divider 52, a 2-frequency divider 53, a phase comparator 54, a delay time control voltage generation unit 55, and a low pass filter (LPF) 56. Also, the delay circuit 58 (DLY) shown in FIG. 12 corresponds to the block combining the first and second delay circuits 32 and 33 in FIG. 9 and the gates G(0) to $G(2^n-1)$ in FIG. 11

The reference signal generation circuit 51 is formed by a ring oscillator in form using delay gates equivalent to the delay gates constituting the circuit 58 (DLY).

Here, when it is assumed that the number of gates used for the delay circuit 58(DLY) is k×n and the number of gates used in the reference signal generation circuit 51 is n, the reference signal generation circuit 51 generates a signal of a frequency of k/2 times which is an inverse number of the whole delay time of the delay circuit 58 (DLY).

The k-frequency divider 52 divides the frequency of the output reference signal of the reference signal generation circuit 51 by k and outputs the result to the frequency phase comparator 54.

In this way, by dividing the frequency of the output reference signal of the reference signal generation circuit 51 by k using the k-frequency divider 52, a signal having a frequency equivalent to that generated when the delay circuit 58 (DLY) is oscillated by the ring oscillator method can be generated.

The 2-frequency divider 53 receives the clock pulse $CLKP_1$ from the differential amplifier combines the clock pulses $CLKP_{1B}$ and $CLKP_{1B\_}$ thereat, divides the same in frequency by 2, and outputs the result to the phase comparator 54.

The phase comparator 54 compares the output signal of the k-frequency divider 52 with the output signal of the frequency divider 53 and outputs the signal having the level responsive to the phase difference to the delay time control voltage generation unit 55.

The delay time control voltage generation unit 55 generates a delay time control voltage in accordance with the level of the output signal of the phase comparator This delay time control voltage is output via the low pass filter 56 to the reference signal generation circuit 51 and the delay circuit 58 (DLY) as the control signal CTL.

Namely, the delay time control circuit 39 performs control so that it compares the phase of the signal obtained by dividing the frequency of the output signal of the reference signal generation circuit 51 comprising the ring oscillator using the delay gates equivalent to the delay gates constituting the delay circuit 58 (DLY) by k, and the phase of the signal obtained by dividing the frequency of the clock pulse $CLKP_1$ by 2, thereby equivalently performing the comparison of the frequency of the delay circuit 58 (DLY) and the clock period, detects the phase deviation therebetween as the control voltage, inputs the same to the delay circuit 58 (DLY), and makes the delay time of the delay circuit 58 (DLY) match with the clock period.

Next, the operation with the above-described structure will be explained referring to the timing chart of FIGS. 10A to 10M.

First, the input clock signal CLK of the predetermined period is input to the pulse shaper 31 and the first register 34.

In the pulse shaper 31, the input clock signal CLK is converted to the clock pulses $CLKP_{1B}$ and $CLKP_{1B\_}$ having narrow pulse widths using the rising edge thereof as a reference. These are output to the first delay circuit 32 and the delay time control circuit 39. Note that, the width of the clock pulses $CLKP_{1B}$ and $CLKP_{1B\_}$ is converted to one that can sufficiently pass the first and second delay circuits 32 and 33 and is enough to generate the pulse at the last stage of the RS-FF circuit 40.

Also, in the first register 34, the 8 bits of pulse width set up data PWD0 to PWD7 for setting the pulse width of the output pulse $PWM_{OUT}$ by the RS-FF circuit 40 are fetched at the rising timing of the input clock signal CLK and held.

In the delay time control circuit 39 to which the clock pulses $CLKP_{1B}$ and $CLKP_{1B\_}$ are input, these input clock pulses are combined as the clock pulse $CLKP_1$ at the differential amplifier. The clock pulse $CLKP_1$ is divided in frequency by 2 by the 2-frequency divider 53 and input to the frequency phase comparator 54.

Also, in the delay time control circuit 39, the reference signal is generated at the ring oscillator type reference signal generation circuit 51 constituted by using the delay gates equivalent to the delay gates constituting the delay circuit DLY corresponding to the block combining the first and second delay circuits 32 and 33. This reference signal is divided in frequency by k at the k-frequency divider 52 and input to the phase comparator In the phase comparator 54, a comparison is carried out between the phase of the output signal of the k-frequency divider 52 and the phase of the signal obtained by dividing the frequency of the clock input $CLKP_1$ by 2. The signal of the level in accordance with the phase difference therebetween is input to the delay time control voltage generation unit 55.

In the delay time control voltage generation unit 55, a delay time control voltage in accordance with the phase difference of the phase comparator 54 is generated. This delay time control voltage is fed via the low pass filter 56 to the bases of the transistors $Q_6$ and $Q_7$ constituting the current source of the emitter-follower output stage B of the first delay circuit 32 and second delay circuit 33 constituting the reference signal generation circuit 51 and the delay circuit DLY as the control signal CTL, and fed back to the reference signal generation circuit 51.

Namely, in the delay time control circuit 39, a comparison is equivalently carried out of the frequency of the delay circuit DLY and the clock period, the amount of phase deviation therebetween is detected as the control voltage and input to the first and second delay circuits 32 and 33, and control is performed so that the delay time of the first and second delay circuits 32 and 33 is matched to the clock period.

In the first delay circuit 32, the clock pulses $CLK_{1B}$ and $CLKP_{1B\_}$ from the pulse shaper 31 are delayed. The delay time can be controlled based on the control signal CTL output from the delay time control circuit 39. The clock pulses subjected to the delay action are output as the clock pulses $CLKP_{2B}$ and $CLKP_{2B\_}$ to the second delay circuit 33.

In FIG. 11, the delayed clock pulses output from the respective emitter-follower stages B in the respective gates $G(0)$ to $G(2^n-1)$ are input to a set pulse output circuit SET-CCT. The set pulse output circuit SET-CCT includes a plurality $(2^n-1)$ of selection gates. One of selection gate corresponding to the decoded data from the first decoder 37 is energized to output the delayed clock pulse applied thereto as the set pulse $SET_B$ to the set signal input terminal of the RS-FF circuit 40, resulting in the set status of the RS-FF circuit 40.

Also, in the first delay circuit 32, when the clock pulses $CLKP_{1B}$ and $CLKP_{1B\_}$ pass the delay gate stage positioned substantially at the center, they are output as the read-in allowing signals $S_{2B}$ to the third register 36.

In the second delay circuit 33 to which the clock pulses $CLKP_{2B}$ and $CLKP_{2B\_}$ subjected to a delay action of a predetermined time at the first delay circuit 32 are input, the clock pulses $CLKP_{2B}$ and $CLKP_{2B\_}$ are delayed. The delayed time can be controlled based on the control signal CTL output from the delay time control circuit 39.

In FIG. 11, the delayed clock pulses output from the respective emitter-follower stages B in the respective gates $G(2^n-1)$ to $G(2^n-1)$ are input to a reset pulse output circuit RESET-CCT. The reset pulse output circuit RESET-CCT includes a plurality $(2^n-1)$ of selection gates. One of the selection gate corresponding to the decoded data from the second decoder 38 is energized to output the delayed clock pulse applied thereto as the reset pulse $RST_B$ to the reset signal input terminal of the RS-FF circuit 40, resulting in the reset status of the RS-FF circuit 40.

Also, in the second delay circuit 33, when the clock pulses $CLKP_{2B}$ and $CLKP_{2B\_}$ pass the delay gate stage positioned substantially at the center, they are output as the read-in allowing signals $S_{3B}$ to the second register 35.

In the second register 35 receiving the read-in allowing signal $S_{3B}$ by the second delay circuit 33, the data $D_{4B}$ held in the first register 34 is fetched at a rising timing of the read-in allowing signal $S_{3B}$ and the data is rewritten and output to the first decoder 37 and the third register 36 corresponding to the former half period of the clock.

Also, in the third register 36 receiving the read-in allowing signal $S_{2B}$ by the first delay circuit 32, the data $D_{5B}$ held in the second register 35 is fetched at a rising timing of the read-in allowing signal $S_{2B}$, and the data is rewritten and output to the second decoder 38 corresponding to the latter half period of the clock.

In the first decoder 37 to which the data held in the second register 35 is input, the decoding of the pulse width set up data PWD is suspended until the clock pulses $CLKP_{2B}$ and $CLKP_{2B\_}$ reach the last stage of the second delay circuit 33. The output of which stage of the delay gates is to be selected is set up before the clock pulses $CLKP_{1B}$ and $CLKP_{1B\_}$ corresponding to the next pulse period T are input to the first delay circuit 32.

For example, when the clock pulses $CLKP_{1B}$ and $CLKP_{1B\_}$ of the next period T soon pass the delay gate positioned at substantially the center of the first delay circuit 32 and the read-in allowing signal $S_{2B}$ is output, as mentioned above, the pulse width set up data $D_{5B}$ corresponding to the latter half period in the stopping state at present is fetched into the third register 36 from the second register 35 as mentioned above, and the rewriting is carried out.

In the second decoder 38 to which the data held in the third register 36 is input, the decoding of the pulse width set up data PWD is suspended until the clock pulses $CLKP_{1B}$ and $CLKP_{1B\_}$ reach the last stage of the first delay circuit 32. The output of which stage of the delay gates is to be selected is set before the clock pulses $CLKP_{2B}$ and $CLKP_{2B\_}$ based on these clock pulses $CLKP_{1B}$ and $CLKP_{1B\_}$ are input to the second delay circuit 33.

As described above, the pulse $PWM_{OUT}$ of the pulse width in accordance with the pulse width set up data PWD is output from the RS-FF circuit 40 to which the set pulse $SET_B$ output from the first delay circuit 32, whose delay time is controlled by the first decoder 37 and the delay time control circuit 39, and a reset pulse $RST_B$ output from the second delay circuit 33, whose delay time is controlled by the second decoder 38 and the delay time control circuit 39, are input.

As explained above, according to the present embodiment, provision is made of a reference signal generation circuit 51 which generates a signal of a frequency of k/2 which is of an inverse number of the whole delay time of the delay circuit DLY comprising the first and second delay circuits 32 and 33. The delay time control circuit 39 is further provided, which clock generates a signal of frequency equivalent to that when the delay circuit DLY is oscillated by the ring oscillator method by dividing the frequency of the output signal of the reference signal generation circuit 51 by k by the k-frequency divider 52, performs a comparison of phase between the k-frequency-divided signal and the signal obtained by dividing the frequency of the clock pulse $CLKP_1$ by 2 at the 2-frequency divider 53 at the frequency phase comparator 54, detects the phase difference thereof as the control voltage and inputs the same to the delay circuit DLY, thereby controlling the delay time of the delay circuit DLY so as to match with the clock period, and therefore not only a correct gradation expression can be realized irrespective of manufacturing variations and fluctuations in the environment of use, but also the operation frequency range can be broadened, a plurality of degrees of resolutions can be coped with by one circuit, and a reduction of cost can be achieved.

Note that, in the present embodiment, the 2-frequency divider is used as the frequency dividing means of the input clock pulse $CLKP_{1B}$, but of course it is also possible to use a frequency divider dividing the frequency with a frequency ratio more than this.

In this case, when assuming that the frequency division of the input clock pulse $CLKP_{1B}$ is m, it is sufficient so far as the frequency divider of the reference signal is a (k+m)/2-frequency divider.

As explained above, according to the present invention, not only can a correct gradation expression be realized irrespective of manufacturing variations and fluctuations in the environment of use, but also the operation frequency range can be broadened.

Moreover, there also exists an advantage that a plurality of degrees of resolutions can be coped with by one circuit, and therefore a reduction of cost can be achieved.

Figure 13:
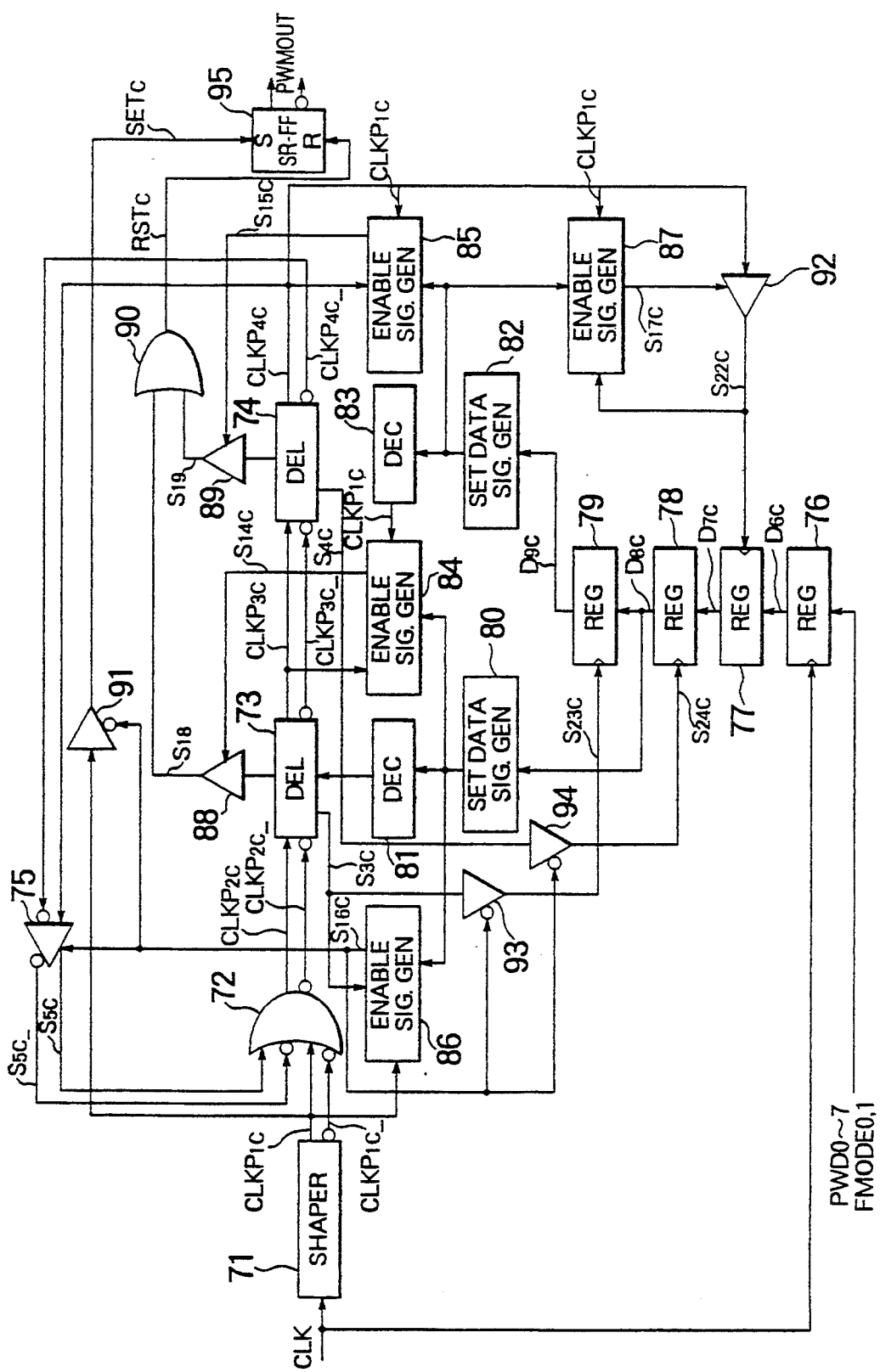
FIG. 13 is a block diagram of the pulse width modulation circuit of a fourth embodiment of the present invention.
Figure 14:
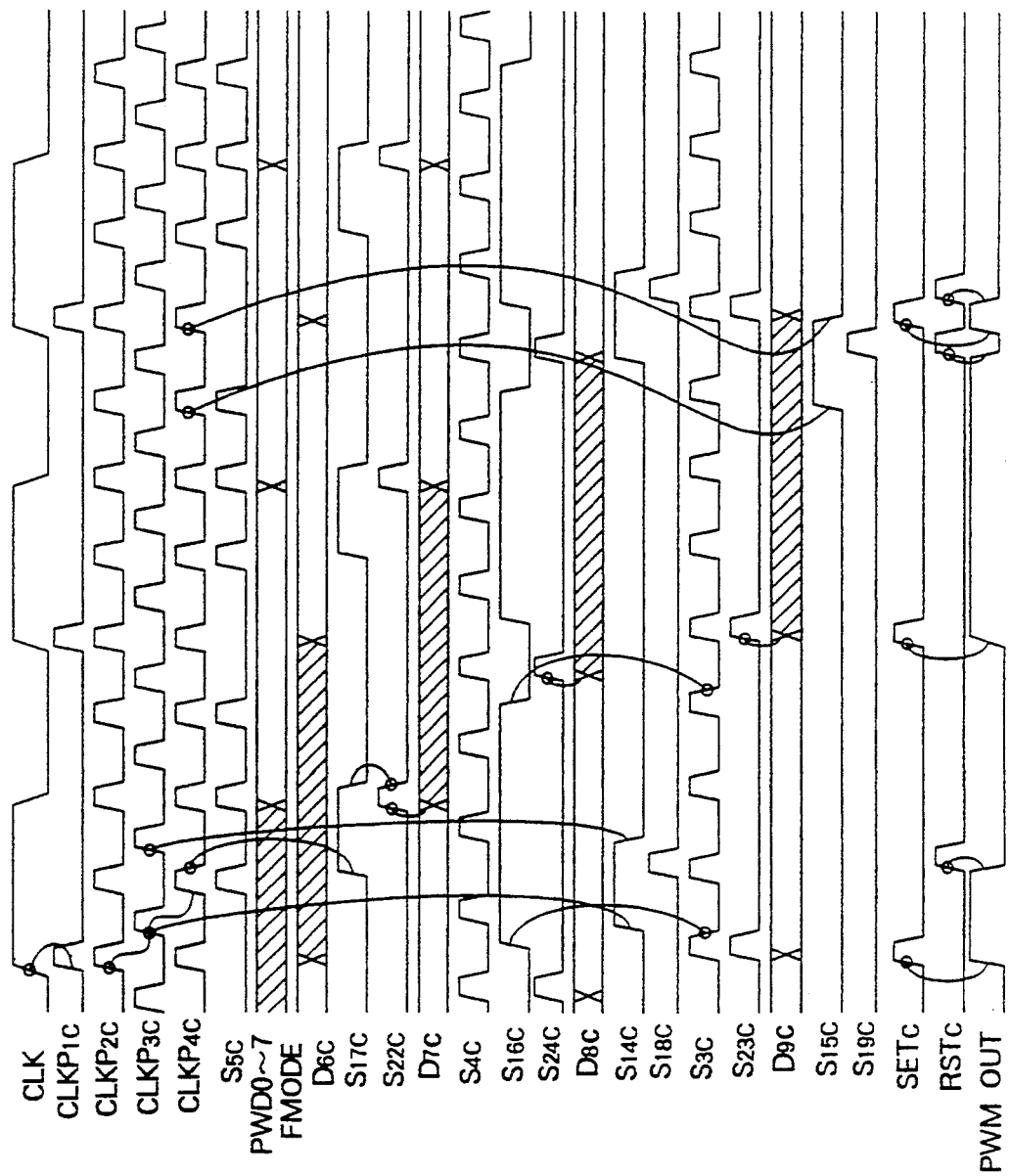
FIGS. 14A to 14Z are timing charts for explaining the operation of the pulse width modulation circuit of the fourth embodiment of the present invention shown in FIG. 13.

FIG. 13 is a block diagram showing a fourth embodiment of a pulse width modulation circuit according to the present invention; and FIG. 14A to 14Z are timing charts showing input/output waveforms in respective portions of the circuit of FIG. 13.

The PWM circuit of FIG. 13 is a circuit corresponding to a so-called LP (left pulse) mode which generates a pulse from the top of the clock period. It has a circuit structure that raises the pulse at the rising of the clock and generates the timing determining when the pulse should fall in the delay circuit.

In FIG. 13, 71 denotes a pulse shaper; 72, a differential circuit type 2-input OR gate; 73, a first programmable delay circuit (hereinafter referred to as a delay circuit); 74, a second delay circuit; 75, a gate for a loop; 76, a first register; 77, a second register; 78, a third register; 79, a fourth register; 80, a first set up data signal generation circuit; 81, a first decoder; 82, a second set up data signal generation circuit; 83, a second decoder; 84, a first enable signal generation circuit; 85, a second enable signal generation circuit; 86, a third enable signal generation circuit; 87, a fourth enable signal generation circuit; 88, a first gate for resetting; 89, a second gate for resetting; 90, a 2-input OR gate for resetting; 91, a gate for setting; 92, a first gate for register; 93, a second gate for register; 94, a third gate for register; and 95, an RS-FF circuit; respectively.

Also, PWD0 to PWD7 denote the pulse width set up data; and FMODE0 and FMODE1 denote the repetition set up data for setting how many times the reference pulse signal for the generation of timing should pass through the first and second delay circuits 73 and 74; respectively.

Also, in the timing chart of FIGS. 14A to 14Z, the part given the hatching indicates the same pulse width set up data.

The pulse shaper 71 converts the input clock signal CLK to a clock pulse $CLKP_{1C}$ having a narrower pulse width than that of the input clock signal CLK and an inversion pulse $CLKP_{1C\_}$ thereof based on the rising edge of the input clock signal CLK and outputs the same to the OR gate 72. Also, the pulse shaper 71 outputs the clock pulse $CLKP_{1C}$ to the first to fourth enable signal generation circuits 84 to 87 and the setting gate 91. Here, it is converted to a pulse width that can sufficiently pass the first and second delay circuits 73 and 74 and is enough to generate the pulse at the RS-FF circuit 95 in the last stage.

The OR gate 72 inputs the clock pulses $CLKP_{1C}$ and $CLKP_{1C\_}$ output from the pulse shaper 71, and the clock pulses $S_{5C}$ and $S_{5C}$ and $S_{5C-}$ which passed the first and second delay circuits 73 and 74 and are looped via the gate 75, differential-OR$_S$ them, and outputs the clock pulses $CLKP_{2C}$ and $CLKP_{2C-}$ to the first delay circuit 73.

The first delay circuit 73 is constituted by a plurality of stages of delay gates which output the clock pulses $CLKP_{2C}$ and $CLKP_{2C-}$ output from the OR gate 72 while delaying the same by a predetermined delay time each, and a plurality of selection gates respectively corresponding to the delay gates, connected in series. The circuit 73 delays the clock pulses $CLKP_{2C}$ and $CLKP_{2C-}$, outputs the same as the clock pulses $CLKP_{3C}$ and $CLKP_{3C-}$ to the second delay circuit 74, and outputs the clock pulse $CLKP_{3C}$ to the first enable signal generation circuit 84.

Also, the first delay circuit 73 outputs the delayed clock pulse $CLKP_{2C}$ for resetting from substantially the center position of the respective delay gate groups to the first gate 88 and outputs the delayed clock pulse $CLKP_{2C}$: the signal $S_{3C}$ from the delay gates in the order of the predetermined stage to the third enable signal generation circuit 86 and the register-use second gate 93.

The second delay circuit 74 is constituted by a plurality of stages of delay gates which output the clock pulses $CLKP_{3C}$ and $CLKP_{3C-}$ output from the first delay circuit 73 while delaying the same by a predetermined delay time each, and a plurality of selection gates respectively corresponding to the delay gates, connected in series. The circuit 74 delays the clock pulses $CLKP_{3C}$ and $CLKP_{3C-}$ from the first delay circuit 73 outputs the same as the clock pulses $CLKP_{4C}$ and $CLKP_{4C-}$ to the loop gate 75, and outputs the clock pulse $CLKP_{4C}$ to the second enable signal generation circuit 85.

Also, the second delay circuit 74 outputs the delayed clock pulse $CLKP_{3C}$ for resetting from substantially the center position of the respective delay gate groups to the second gate 89, and outputs the delayed clock pulse $CLKP_{3C}$: the signal $S_{4C}$ from the delay gate in an order of the predetermined stage to the register-use third gate The loop gate 75 inputs the clock pulses $CLKP_{4C}$ and $CLKP_{4C-}$ output from the second delay circuit 74, and outputs the same as the signals $S_{5C}$ and $S_{5C-}$ to the OR gate 72 in a period during which the enable signal $S_{16C}$ due to the enable signal generation circuit 86 is being input at a high level.

A ring-shaped loop path of the clock pulse is formed by OR gate 72, first delay circuit 73, second delay circuit 74, and the gate 75, and the clock pulse which is shaped narrower in pulse width by the pulse shaper 71 can pass the first and second delay circuits 73 and 74 a plurality of times.

More concretely, the constitution is made so that this operation is repeated exactly by the number of times in accordance with the operation frequency, and the clock pulse can pass the first and second delay circuits 73 and 74 $2^n$ times (where, n is a positive integer). In this example, as shown in FIGS. 14A to 14Z, the opening and closing control of the gate 75 is carried out by the enable signal $S_{16C}$ by the third enable signal generation circuit 86 so as to pass a clock pulse four times one clock period.

The first register 76 fetches 8 bits of pulse width set up data PWD0 to PWD7 for setting the pulse width of the output pulse $PWM_{OUT}$ by the RS-FF circuit 95 and 2 bits of the repetition set up data FMODE0 and FMO-DE1 at the timing of rising of the input clock signal CLK and outputs the fetched data $D_{6C}$ to the second register 77.

The second register 77 fetches the data $D_{6C}$ held in the first register 76 at the timing of rising of the output pulse signal $S_{22C}$ of the register-use first gate 92 and rewrites the same and outputs the fetched data $D_{7C}$ to the third register 78.

The fetching of the data $D_{6C}$ of the second register 77 is carried out at a timing of ½ of the clock period, and that timing is controlled by opening or closing the register-use first gate 92 by the enable signal $S_{17C}$ by the fourth enable signal generation circuit 87 as will be described later.

The third register 78 fetches the data $D_{7C}$ held in the second register 77 at the timing of rising of the output pulse signal $S_{24C}$ of the register-use third gate 94 and rewrites the same and outputs the rewritten data $D_{8c}$ to the first set up data signal generation circuit 80 and the fourth register 79.

This timing of fetching of the data $D_{7C}$ of the third register 78 is made a timing, when the clock pulse $CLKP_{3C}$ passes the middle or leading position of the second delay circuit 74, that is, after the clock pulse passes the first delay circuit 73. The fetching is carried out by the last pulse of the clock period.

The fourth register 79 fetches the data $D_{8c}$ held in the third register 78 at the timing of rising of the output pulse signal $S_{23C}$ of the register-use second gate 93 and rewrites the same and outputs the rewritten data $D_{9c}$ to the second set up data signal generation circuit 82.

This timing of fetching of the data $D_{9c}$ of the fourth register 79 is carried out at a timing, when the clock pulse $CLKP_{2C}$ passes the middle or leading position of the first delay circuit 73, that is, after the clock pulse passes the second delay circuit 74 and the fetching is carried out by the leading pulse of the clock period.

The first set up data signal generation circuit 80 produces a pulse width set up data PWD for setting the delay time of the first delay circuit 73, outputs the same to the first decoder 81 and the first enable signal generation circuit 84, and decodes the repetition set up data FMODE and outputs the same to the third enable signal generation circuit 86.

The concrete generation of the pulse width set up data is such that the pulse width set up data PWD fetched into the third register 78 is shifted in accordance with the input of the repetition set up data FMODE and output to the first decoder 81 and the first enable signal generation circuit 84.

The first decoder 81 sets up the output timing of the first delay circuit 73 in response to the set up data by the first set up data signal generation circuit 80 and outputs the result thereof to the first delay circuit 73.

The second set up data signal generation circuit 82 produces a pulse width set up data PWD for setting the delay time of the second delay circuit 74 and outputs the same to the second decoder 83, the second enable signal generation circuit 85, and a fourth enable signal generation circuit 87.

Specifically, in generating the set up data, the pulse width set up data PWD fetched into the fourth register 79 is shifted in accordance with the input of the repetition set up data FMODE and output to the second decoder 83, the second enable signal generation circuit 85, and the fourth enable signal generation circuit 87.

The second decoder 83 sets up the output timing of the second delay circuit 74 in response to the set up data by the second set up data signal generation circuit 82 and outputs the result thereof to the second delay circuit 74.

The first enable signal generation circuit 84 produces a high level enable signal $S_{14C}$ at the timing of the rising of the predetermined clock pulse $CLKP_{3C}$ when receiving as its inputs the clock pulse $CLKP_{1C}$ output from the pulse shaper 71, the clock pulse $CLKP_{3C}$ output from the first delay circuit 73, and the output signal of the first set up data signal generation circuit 80, outputs the same to the first gate 88 for resetting, and changes over the output enable signal $S_{14C}$ to a low level at the timing of rising of the next input clock pulse $CLKP_{3C}$.

The second enable signal generation circuit 85 produces a high level enable signal $S_{15C}$ at the timing of the rising of the predetermined clock pulse $CLKP_{4C}$ when receiving as its inputs the clock pulse $CLKP_{1C}$ output from the pulse shaper 71, the clock pulse $CLKP_{4C}$ output from the second delay circuit 74, and the output signal of the second set up data signal generation circuit 82, outputs the same to the second gate 89 for resetting, and changes over the output enable signal $S_{15C}$ to a low level at the timing of the rising of the next input clock pulse $CLKP_{4C}$.

The third enable signal generation circuit 86 produces an enable signal $S_{16C}$ for looping the clock pulse exactly by the number of times based on the set up data signal when receiving as its inputs the clock pulse $CLKP_{1C}$ output from the pulse shaper 71, the output pulse signal $S_{3C}$ of the first delay circuit 73, and the output data signal of the first set up data signal generation circuit 80, concretely, the repetition set up data signal which is decoded, and outputs the same to the gate 75 for loop, the gate 91 for setting, the register-use second gate 93, and the register-use third gate 94.

Concretely, it produces a high level enable signal $S_{16C}$ at the timing of the falling of the signal $S_{3C}$ (clock pulse $CLKP_{2C}$) and changes it over to the low level at the timing of the falling of the third input signal $S_{3C}$ from that input signal $S_{3C}$.

Namely, an operation of outputting the enable signal $S_{16C}$ at a high level is repeated in the period from the timing from the falling of the first clock pulse $S_{3C}$ to the falling of the fourth clock pulse $S_{3C}$ when treating four clock pulses $S_{3C}$ as one set.

When receiving as its inputs the clock pulse $CLKP_{1C}$ output from the pulse shaper 71, the clock pulse $CLKP_{4C}$ output from the second delay circuit 74, and the output signal of the second set up data generation circuit 82, the fourth enable signal generation circuit 87 outputs the enable signal $S_{17C}$ for inputting only the clock pulse $CLKP_{4C}$ of the timing of ½ of the clock period as the signal $S_{22C}$ to the second register 77 to the register-use first gate 82, and stops the output of the enable signal $S_{17C}$ in accordance with the input of the output signal $S_{22C}$ of the register-use first gate 82.

Concretely, it produces a high level enable signal $S_{17C}$ at the timing of the falling of the second order clock pulse $CLKP_{4C}$ in one clock period, and changes it over to a low level at the timing of falling of the output signal $S_{22C}$ of the gate 92 receiving this.

The first gate 88 for resetting holds the open state for a period during which the enable signal $S_{14C}$ by the first enable signal generation circuit 84 is input at a high level and outputs the clock pulse $CLKP_{2C}$ passing the first delay circuit 73 as the pulse signal $S_{18C}$ to the 2-input OR gate 90.

The second gate 89 for resetting holds the open state for a period during which the enable signal $S_{15C}$ by the second enable signal generation circuit 85 is input at a high level and outputs the clock pulse $CLKP_{3C}$ passing the second delay circuit 74 as the pulse signal $S_{19C}$ to the 2-input OR gate 90.

The 2-input OR gate 90 takes the logical OR of the output pulse signals $S_{18C}$ and $S_{19C}$ of the first and second gates 88 and 89 for resetting and outputs the result thereof as the reset pulse RSTc to the reset signal input terminal R of the RS-FF circuit 95.

The gate 91 for setting holds the open state for a predetermined period during which the enable signal $S_{16C}$ by the third enable signal generation circuit 86 is input at a low level and outputs the clock pulse $CLKP_{1C}$ by the pulse shaper 71 as the set pulse SETc to the set signal input terminal S of the RS-FF circuit 95.

The register-use first gate 92 holds the open state for a period during which the enable signal $S_{17C}$ by the fourth enable signal generation circuit 87 is input at a low level and outputs the clock pulse $CLKP_{4C}$ subjected to the delay function by the second delay circuit 74 to the second register 77 and the fourth enable signal generation circuit 87.

The register-use second gate 93 holds the open state for a predetermined period during which the enable signal $S_{16C}$ by the third enable signal generation circuit 86 is input at a low level and outputs the clock pulse $CLKP_{3C}$ by the first delay circuit 73 as the signal $S_{23C}$ to the fourth register 79.

The register-use third gate 94 holds the open state for a predetermined term during which the enable signal $S_{16C}$ by the third enable signal generation circuit 86 is input at a low level and outputs the clock pulse $CLKP_{4C}$ by the second delay circuit 74 as the signal $S_{24C}$ to the third register 78.

The RS-FF circuit 95 outputs the high level output pulse $PWM_{OUT}$ until the reset pulse $RST_c$ by the 2-input OR gate 90 is input to the reset signal input terminal R when receiving as its input the set pulse $SET_c$ by the gate 91 to the set signal input terminal S.

An explanation will be made next of a fifth embodiment of the present invention.

A concrete example of the circuit of the first set up data generation circuit 110 and first and third enable signal generation circuits 114 and 116 will be explained with reference to FIG. 15.

Note that, here, for simplification of the explanation, the explanation will be made of an example of the first set up data generation circuit 110 and the first and third enable signal generation circuits 114 and 116 in a case where the number of gates of all the delay circuits, that is, the first and second delay circuits 103 and 104, is set to 15, i.e., G1A to G15A, that is, the pulse width set up data is composed of 5 bits.

Also, here, it is determined that the pulse signal which becomes a reference for generating the timing passes the first and second delay circuits 103 and 104 at least two times.

Figure 15:
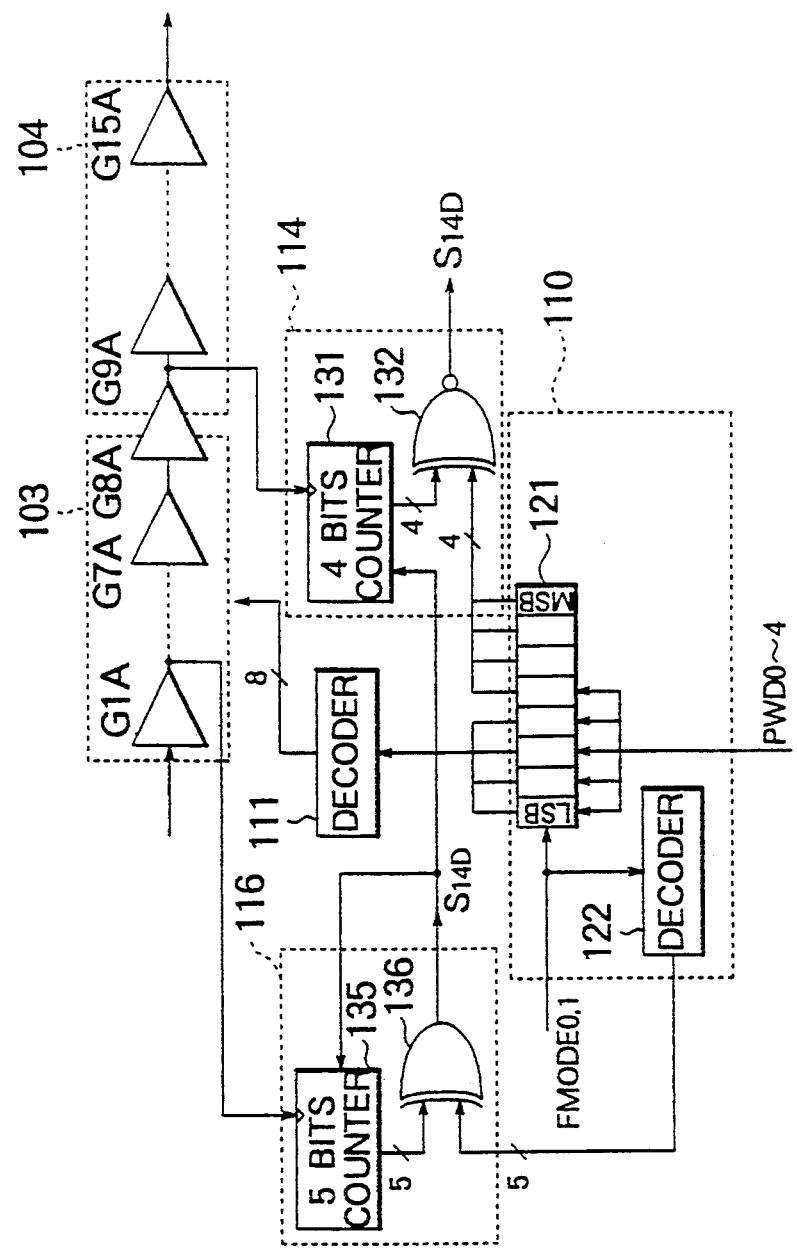
FIG. 15 is a concrete circuit diagram of the pulse width modulation circuit of the fifth embodiment of the present invention.

As shown in FIG. 15, in the present example, the first set up data generation circuit 110 is constituted by the shift register 121 and the decoder 122, the first enable signal generation circuit 114 is constituted by a 4-bit counter 131 and an exclusive NOR gate 132, and the third enable signal generation circuit 116 is constituted by a 5-bit counter 135 and an exclusive OR gate 136.

In such a structure, in the shift register 121 of the first set up data signal generation circuit 110, the pulse width set up data PWD is shifted to the MSB (most significant bit) side in accordance with the input of the repetition set up data FMODE. In this shift register 121, the part to which no effective data is input becomes "0".

Also, in the decoder 122 of the first set up data signal generation circuit 110, the data to be input to the third enable signal generation circuit 116 is produced from the FMODE input.

In the third enable signal generation circuit 116, the output signal of the decoder 122 of the first set up data signal generation circuit 110 and the output of the 5-bit counter 135 are compared at the exclusive OR gate 136 and the counter enable signal $S_{14D}$ is produced and is output to the counters 135 and 131.

In the first enable signal generation circuit 114, bits on the MSB side of the shift register 121 of the first set up data signal generation circuit 110 and the number of repetitions are counted at the 4-bit counter 131. They are compared at the exclusive NOR gate 132. The enable signal $S_{14D}$ is produced when the respective outputs are equal and output to the first gate for resetting.

Also, in the first decoder 111, 4 bits on the LSB (least significant bit) side of the first set up data signal generation circuit 110 are decoded, and the result thereof is output to the first delay circuit 103.

Here, the fourth order bit from the LSB is used as the enable signal for deciding whether the first delay circuit 103 should output or not. In the first delay circuit 103, the delay circuit output is enabled in the case of "0".

Note that, also the second set up data signal generation circuit, second decoder, and second enable signal generation circuit accompanying the second delay circuit 104 are constituted by equivalent circuits to the circuits of FIG. 15.

Note the constitution is made so that, when the fourth order bit from the LSB side of the shift register in the second set up data signal generation circuit used as the enable signal to determine whether the output of the delay circuit should be carried out is "1", the delay circuit output is enabled.

FIG. 16 is a view showing an example of the output signal of the decoder 122 in the set up data signal generation circuit shown in FIG. 15 and number of shifts of the shift register 121.

As shown in FIG. 16, where the repetition set up data FMODE0 and FMODE1 are "00 (hexadecimal notation)", the output of the decoder 121 becomes "00010 (binary notation)", the number of shifts of the shift register 121 becomes "0", and the number of repetitions in this case becomes "2".

Similarly, in a case where the repetition set up data FMODE0 and FMODE 1 are "01 (hexadecimal notation)" the output of the decoder 121 is "00100 (binary notation)", the number of shifts of the shift register 121 becomes "1", and the number of repetitions in this case becomes "4".

In a case where the repetition set up data FMODE0 and FMODE 1 are "10 (hexadecimal notation)", the output of the decoder 121 is "01000 (binary notation)", the number of shifts of the shift register 121 becomes "2", and the number of repetitions in this case becomes "8".

Also, in a case where the repetition set up data FMODE0 and FMODE 1 are "11 (hexadecimal notation)", the output of the decoder 121 is "10000 (binary notation)", the number of shifts of the shift register 121 becomes "3", and the number of repetitions in this case becomes "16".

Next, an operation according to the above-described structure will be explained with reference to FIG. 13.

First, the input clock signal CLK of a predetermined period is input to the pulse shaper 71 and the first register 76.

In the pulse shaper 71, the input clock signal CLK is converted to the clock pulses $CLKP_{1C}$ and $CLKP_{1C-}$, having a narrow pulse width than that of the input clock signal CLK, based on the rising edge thereof, which are output to the OR gate 72. The clock pulses $CLKP_{1C}$ is output to the first to fourth enable signal generation circuits 84 to 87.

Note that, in the pulse shaping by the pulse shaper 71, the conversion is carried out so that the pulse width can sufficiently pass the first and second delay circuits 73 and 74 and is enough to generate the pulse at the RS-FF circuit 95 in the last stage.

Also, in the first register 76, at a timing of the rising of the input clock signal CLK, 8 bits of pulse width set up data PWD0 to PWD7 for setting the pulse width of the $PWM_{OUT}$ by the RS-FF circuit 95 and the 2 bits of repetition set up data FMODE0 and FMODE1 are fetched and writing is carried out. The fetched data $D_{6C}$ is output to the second register 77.

The clock pulses $CLKP_{1C}$ and $CLKP_{1C-}$ input to the OR gate 72 are input as the clock pulses $CLKP_{2C}$ and $CLKP_{2C-}$ to the first delay circuit 73.

In the first delay circuit 73, the input clock pulses $CLKP_{2C}$ and $CLKP_{2C-}$ are delayed based on the delay time decoded at the first decoder 81 in accordance with the pulse width set up data PWD and output as the clock pulses $CLKP_{2C}$ and $CLKP_{2C-}$ to the second delay circuit 74. The clock pulse $CLKP_{3C}$ is output to the first enable signal generation circuit Also, in the first delay circuit 73, the clock pulse $CLKP_{2C}$ for resetting is output from substantially the center position of the respective delay gate groups to the first gate 88, and the delayed clock pulse $CLKP_{2C}$ as the signal $S_{3C}$ is output from the delay gate in the predetermined stage order to the third enable signal generation circuit 86 and the register-use second gate 93.

In the second delay circuit 74 to which the clock pulses $CLKP_{3C}$ and $CLKP_{3C-}$ subjected to the delaying action at the first delay circuit 73 are input, the clock pulses $CLKP_{3C}$ and $CLKP_{3C-}$ by the first delay circuit 75 are delayed based on the delay time decoded at the second decoder 83 in accordance with the pulse width set up data PWD, these are output as the clock pulses $CLKP_{4C}$ and $CLKP_{4C-}$ to the gate 75, and the clock pulse $CLKP_{4C}$ is output to the second enable signal generation circuit 85 and the register-use first gate 22.

Also, in the second delay circuit 74, the delayed clock pulse $CLKP_{3C}$ for resetting is output from substantially the center position of the respective delay gate groups to the second gate 89, and the clock pulse $CLKP_{2C}$ is output from the delay gate in the predetermined stage order as the signal $S_{4C}$ to the third register-use gate 93.

In the third enable signal generation circuit 86 to which the clock pulse $CLKP_{1C}$ by the pulse shaper 71 is input and the signal $S_{3C}$ by the first delay circuit 73 is input, a high level enable signal $S_{16C}$ is produced at the timing of the falling of the signal $S_{3C}$ and output to the gate 75, the setting gate 91, and the register-use second and third gates 93 and The gate 75 is held in an open state for the period during which the high level enable signal $S_{16C}$ is input, and the clock pulses $CLKP_{4C}$ and $CLKP_{4CB-}$ by the second delay circuit 74 are input as the pulse signals $S_{5C}$ and $S_{5C-}$ to the first delay circuit 73 via the OR gate 72. Then, this pulse is sent in a loop path so as to pass the first and second delay circuits 73 and 74 exactly the number of times set up by the repetition set up data FMODE in a term during which the enable signal $S_{16C}$ is held at a high level.

Contrary to this, the setting gate 91 and the register-use second and third gates 93 and 94 are held in the open state in the predetermined low level period immediately before the enable signal $S_{16C}$ becomes the high level.

By this, the clock pulse $CLKP_{1C}$ by the pulse shaper 71 passes the setting gate 91 and is input as the set pulse SETC to the set input end S of the RS-FF circuit 95, from which the output of the pulse $PWM_{OUT}$ is carried out.

Also, the pulse signal $S_{1C}$ passes the register-use second gate 93 and is input as the signal $S_{23C}$ to the fourth register 79. The pulse signal $S_{4C}$ passes the register-use third gate 94 and is input as the signal $S_{24C}$ to the third register 78.

In the register-use first gate 92 receiving the clock pulse $CLKP_{4C}$ by the second delay circuit 74, the clock pulse $CLKP_{17C}$ corresponding to the timing of $\frac{1}{2}$ of the clock period passes by the enable signal $S_{17C}$ by the fourth enable signal generation circuit 87 and is input as the pulse signal $S_{22C}$ to the second register 77 and the fourth enable signal generation circuit 87.

In the second register 77 receiving the output pulse signal $S_{22C}$ of the gate 92, the data $D_{6C}$ held in the first register 76 is fetched and the rewriting of the data is carried out at the timing of the rising of the pulse signal $S_{22C}$. The result is output to the third register 78.

In the third register 78 receiving the output pulse signal $S_{24C}$ of the gate 94, the data $D_{7C}$ held in the second register 77 is fetched and the rewriting of the data is carried out at the timing of the rising of the pulse signal $S_{24C}$. The result is output to the fourth register 79, and output to the first set up data signal generation circuit 80.

In the fourth register 79 receiving the output pulse signal $S_{23C}$ of the gate 93, the data $D_{8C}$ held in the third register 78 is fetched and the rewriting of the data is carried out at the timing of the rising of the pulse signal $S_{23C}$. The result is output to the second set up data signal generation circuit 82.

In the first set up data signal generation circuit 80 to which the data held in the third register 78 is input, the pulse width set up data PWD for setting the delay time of the first delay circuit 73 is produced, more specifically, the pulse width set up data PWD fetched into the third register 78 is shifted in accordance with the input of the repetition set up data FMODE and output to the first decoder 81 and the first enable signal generation circuit 84, and the repetition set up data FMODE is decoded and output to the third enable signal generation circuit 86.

In the first decoder 81, the output timing of the first delay circuit 73 is set in response to the set up data by the first set up data signal generation circuit 80. The delay function with respect to the clock pulses $CLKP_{2C}$ and $CLKP_{2C-}$ in accordance with the result thereof is carried out at the first delay circuit 73.

In the first enable signal generation circuit 84, a high level enable signal $S_{14C}$ is produced and output to the resetting first gate 88 at the timing of the rising of the predetermined clock pulse $CLKP_{3C}$ in response to the clock pulse $CLKP_{1C}$ output from the pulse shaper 71, the clock pulse $CLKP_{3C}$ output from the first delay circuit 73, and the output signal of the first set up data signal generation circuit 80, and the output enable signal $S_{14C}$ is changed over to a low level at the timing of the rising of the next input clock pulse $CLKP_{3C}$.

The reset-use first gate 88 is held in the open state in the period during which the enable signal $S_{14C}$ by the first enable signal generation circuit 84 is input at a high level. The clock pulse $CLKP_{2C}$ passing the first delay circuit 73 is input to the 2-input OR gate 90 as the pulse signal $S_{16C}$ and input as the reset pulse RSTC to the reset input end R of the RS-FF circuit 95. By this, the output pulse falls to the low level.

In the second set up data signal generation circuit 82 to which the data held in the fourth register 79 is input, the pulse width set up data PWD for setting the delay time of the second delay circuit 74 is produced, more specifically, the pulse width set up data PWD fetched into the fourth register 79 is shifted in accordance with the input of the looping set up data FMODE and output to the second decoder 83, the second enable signal generation circuit 85, and the fourth enable signal generation circuit 87.

In the second decoder 83, the output timing of the second delay circuit 74 is set up in response to the set up data by the second set up data signal generation circuit 82, and the delay function with respect to the clock pulses $CLKP_{3C}$ and $CLKP_{3C-}$ in accordance with the result thereof is carried out at the second delay circuit 74.

In the second enable signal generation circuit 85, a high level enable signal $S_{15C}$ is produced and output to the resetting second gate 89 at the timing of the rising of the predetermined clock pulse $CLKP_{4C}$ in response to the clock pulse $CLKP_{1C}$ output from the pulse shaper 71, the clock pulse $CLKP_{4C}$ output from the second delay circuit 74, and the output signal of the second set up data signal generation circuit 82. The output enable signal $S_{15C}$ is changed over to a low level at the timing of the rising of the next input clock pulse $CLKP_{4C}$.

The reset-use second gate 89 is held in the open state for the period during which the enable signal $S_{15C}$ by the second enable signal generation circuit 85 is input at a high level, the clock pulse $CLKP_{3C}$ passing the second delay circuit 74 is input to the 2-input OR gate 90 as the pulse signal $S_{19C}$, and this is input as the reset pulse $RST_C$ to the reset signal input terminal R of the RS-FF circuit 95. By this, the output pulse falls to the low level.

As explained above, according to the present embodiment, the constitution is made so that a loop path of the clock pulse is formed using the OR gate 72, the first and second delay circuits 73 and 74, and the gate 75 so that the clock pulse passes the first and second delay circuits 73 and 74 exactly by a number of times in accordance with the operation frequency; the opening and closing control of the gates 75, 88, 89, and 91 is carried out in accordance with the enable signals $S_{14C}$, $S_{5C}$, and $S_{16C}$, whereby the timing of rising and falling of the output pulse $PWM_{OUT}$ is generated, and therefore the pulse can be generated even in a case of a lower frequency, an expansion of the operation frequency can be achieved, a plurality of resolutions can be coped with by one circuit, and thus a reduction of costs can be achieved.

Also, a construction using a delay circuit having a period less than the operation frequency is possible, and therefore there is an advantage that a reduction of the current consumption and a reduction of the number of parts can be achieved.

Note that, in this embodiment, the delay circuit is divided into two circuits, but of course it is possible even if there is just one circuit or if the circuit is divided into three or more circuits.

Also, an explanation was made by defining the number of repetitions for the delay of the reference pulse signal as a multiple of 2, but it is also possible even if a pulse is generated repeatedly any number of times.

Further, in this embodiment, the position of generation of the pulse is from the top of the clock period, but the invention is not restricted to this, and it is also possible to change the reference position of generation of the pulse.

Figure 17:
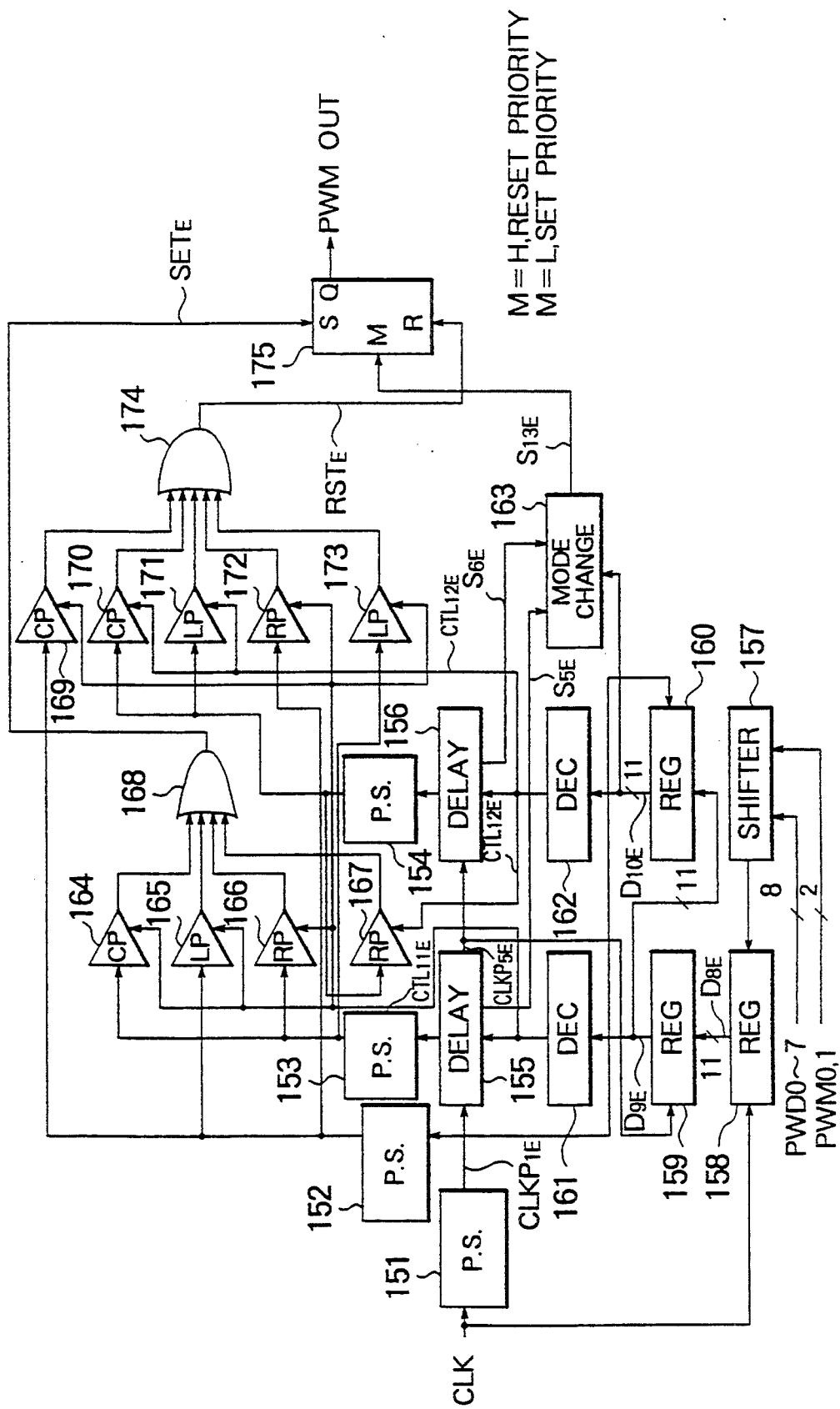
FIG. 17 is a block diagram of a pulse width modulation circuit of a sixth embodiment of the present invention.

In FIG. 17, 151 denotes a first pulse shaper; 152, a second pulse shaper; 153, a third pulse shaper; 154, a fourth pulse shaper; 155, a first programmable delay circuit (hereinafter referred to as a delay circuit); 156, a second delay circuit; 157, a shifter; 158, a first register; 159, a second register; 160, a third register; 161, a first decoder; 162, a second decoder; 163, a mode switch signal generation circuit; 164, a CP gate for setting; 165, an LP mode for setting; 166, a first RP gate for setting; 167, a second RP gate for setting; 168, a 4-input OR gate; 169, a first CP gate for resetting; 170, a second CP gate for resetting; 171, a first LP gate for resetting; 172, an RP gate for resetting; 173, a second LP gate for resetting; 174, a 5-input OR gate; and 175, an RS-FF circuit equipped with a priority order selection function; respectively.

The first pulse shaper 151 converts the input clock signal CLK to a clock pulse $CLKP_{1E}$ having a narrow pulse width using the rising edge of the input clock signal CLK having a frequency of several tens of MHz, for example 20 MHz to 40 MHz as a reference, and outputs the same to the second delay circuit 155, second pulse shaper 152, and the third register 160. Here, the signal is converted to a pulse width of an extent where the pulse does not disappear when passing the first and second delay circuits 155 and 156.

The second pulse shaper 152 shapes the pulse width of the clock pulse $CLKP_{1E}$ output from the first pulse shaper 151 to make it further narrower and outputs the same to the setting LP gate 165, the resetting first CP gate 169, and the resetting RP gate 172, respectively.

The third pulse shaper 153 shapes the pulse width of the clock pulse $CLKP_{1E}$ subjected to the delaying action of a predetermined time at the first delay circuit 155 to further make it narrower and outputs the same to the setting CP gate 164, the setting RP gate 166, and the resetting second LP gate 173, respectively.

The fourth pulse shaper 153 shapes the pulse width of the clock pulse $CLKP_{5E}$ subjected to the delaying action of a predetermined time at the second delay circuit 156 to further make it narrower and outputs the same to the setting RP gate 167, the resetting second CP gate 170, and the resetting first LP gate 171, respectively.

The first delay circuit 155 is constituted by a plurality of stages of delay gates, each of which delays the clock pulse $CLKP_{1E}$ corresponding to the former half period of the pulse period T and output from the first pulse shaper 151 by a predetermined time and outputs the same, and a plurality of selection gates corresponding to the delay gates, respectively, and connected in series. The circuit 155 delays the clock pulse $CLKP_{1E}$ from the first pulse shaper 151 and outputs the same to the second delay circuit 156 and the second register 159.

Also, the first delay circuit 155 outputs the delayed clock pulse $CLKP_{1E}$ as the mode signal $S_{5E}$ from substantially the center position of the respective delay gate groups to the mode switch signal generation circuit 163 and outputs the delayed clock pulse $CLKP_{1E}$ from the delay gate in the predetermined stage order to the third pulse shaper 153.

The second delay circuit 156 is constituted by a plurality of stages of delay gates, each of which delays the clock pulse $CLKP_{5E}$ corresponding to the latter half period of the pulse period T and output from the first delay circuit 155 by a predetermined time and outputs the same, and a plurality of selection gates corresponding to the delay gates, respectively, and connected in series. The circuit 156 delays the clock pulse $CLKP_{5E}$ from the first delay circuit 155 and outputs the same as the mode signal $S_{6E}$ from substantially the center position of the respective delay gate groups to the mode switch signal generation circuit 163, and outputs the delayed clock pulse $CLKP_{5E}$ from the delay gate in the predetermined stage order to the fourth pulse shaper 154.

These first and second delay circuits 155 and 156 are connected in series and act, as a whole, as a timing generation delay circuit generating the timing of the rising and falling of the output pulse $PWM_{OUT}$ for inputting the set pulse $SET_E$ and reset pulse $RST_E$ to the set signal input terminal S and the reset signal input terminal R of the RS-FF circuit 175.

The shifter 157 receives as its inputs the pulse width set up data PWD0 to PWD7 and the mode set up data PWM0 and PWM1 and outputs the same to the first register 158.

The first register 158 generates the 8 bits of pulse width set up data PWD0 to PWD7 for setting the pulse width Of the output pulse $PWM_{OUT}$ by the RS-FF circuit 175 output from the shifter 157 and the 2 bits of mode set up data PWM0 and PWM1 at a timing of rising of the input clock signal CLK and outputs the fetched data $D_{8E}$ to the second register 159.

The second register 159 fetches and rewrites the data $D_{8E}$ held in the first register 158 at the timing of the rising of the clock pulse $CLKP_{5E}$ output from the first delay circuit 155 and outputs the same to the first decoder 161 corresponding to the former half period of the clock and the third register 160.

The third register 160 fetches and rewrites the data $D_{10E}$ held in the second register 159 at the timing of the rising of the clock pulse $CLKP_{1E}$ output from the first pulse shaper 151 and outputs the same to the second decoder 162 corresponding to the latter half period of the clock, and outputs the set up data PWM to the mode switch signal generation circuit 163.

The first decoder 161 decodes the data $D_{9E}$ fetched into the second register 159 and sets up which output of the stages of delay gates should be selected before the clock pulse $CLKP_{1E}$ corresponding to the next pulse period T is input to the first delay circuit 155, outputs the result thereof to the first delay circuit 155, and outputs the control signal $CTL_{11E}$ in accordance with the set up data to the respective control terminals of the setting CP gate 164, setting LP gate 165, and the setting first RP gate 156 and the respective control terminals of the resetting first CP gate 169, resetting RP gate 172, and the resetting LP gate 173, respectively.

The second decoder 162 decodes the data $D_{10E}$ fetched into the third register 160, sets which output of the stages of the delay gates should be selected before the pulse $CLKP_{5E}$ is input to the second delay circuit 156, and outputs the result thereof to the second delay circuit 156, and outputs the control signal CTL$_{12E}$ in accordance with the set up data to the control terminal of the setting second RP gate 167 and the respective control terminals of the resetting second CP gate 170 and the resetting first LP gate 171, respectively.

The mode switch signal generation circuit 163 outputs the mode signal S$_{5E}$ by the first delay circuit 155, the mode signal S$_{6E}$ by the second delay circuit 156, and the mode switch signal S$_{13E}$ of a high level "H" or a low level "L" in accordance with the input of the mode set up data PWM by the third register 160 to the mode selection terminal M of the RS-FF circuit 175 equipped with the priority order selection function.

For example, it outputs the mode switch signal S$_{13E}$ at a high level "H" for giving the priority to the reset pulse when the mode signal S$_{5E}$ by the first delay circuit 155 is input, while outputs the mode switch signal S$_{13E}$ at a high level "L" for giving the priority to the set pulse when the mode signal S$_{6E}$ by the second delay circuit 156 is input.

The setting CP gate 164 controls the input of the clock pulse output from the third pulse shaper 153 to the 4-input OR gate 168 in accordance with the control signal CTL$_{11E}$ by the first decoder 161 at the time of the CP mode.

The setting LP gate 165 controls the input of the clock pulse output from the second pulse shaper 152 to the 4-input OR gate 168 in accordance with the control signal CTL$_{11E}$ by the first decoder 161 at the time of the LP mode.

The setting first RP gate 166 controls the input of the clock pulse output from the third pulse shaper 153 to the 4-input OR gate 168 in accordance with the control signal CTL$_{11E}$ by the first decoder 161 at the time of the RP mode.

Concretely, where the pulse width set up data PWD0 to PWD7 is "00 (hexadecimal notation)" and a so-called 0 percent pulse is set up, this first RP gate 166 stops the input of the clock pulse output from the third pulse shaper 153 to the input OR gate 168 and suppresses the generation of the set pulse SET$_E$.

The setting second RP gate 167 controls the input of the clock pulse output from the fourth pulse shaper 154 to the 4-input OR gate 168 in accordance with the control signal CTL$_{12E}$ by the second decoder 162 at the time of the RP mode.

The 4-input OR gate 168 takes the logical OR of the output pulses of the setting CP gate 164, setting LP mode 165, setting first RP gate 166, and setting second RP gate 167 and outputs the result thereof to the set input end S of the RS-FF circuit 175 as the set pulse SET$_E$.

The resetting first CP gate 169 controls the input of the clock pulse output from the second pulse shaper 152 to the 5-input OR gate 174 in accordance with the control signal CTL$_{11E}$ by the first decoder 161 at the time of the CP mode.

Concretely, at the time of the CP mode, a reset is forcibly applied on a part of the start of the clock period T irrespective of the value of the pulse width set up data PWD0 to PWD7, and therefore this first CP gate 169 is controlled to the open state.

The resetting second CP gate 170 controls the input of the clock pulse output from the fourth pulse shaper 154 to the 5-input OR gate 174 in accordance with the control signal CTL$_{12E}$ by the second decoder 162 at the time of the CP mode.

Concretely, at the time of the CP mode, where the pulse width set up data PWD0 to PWD7 is "FF (hexadecimal notation)" and a so-called 100 percent pulse is set up, this second CP gate 170 stops the input of the clock pulse output from the fourth pulse shaper 154 to the 5-input OR gate 174 so that a reset will not be applied on the part of the start of the next clock period T on which the reset has been forcibly applied by the first CP gate 169 and suppresses the generation of the reset pulse RST$_E$.

The first LP gate 171 controls the input of the clock pulse output from the fourth pulse shaper 154 to the 5-input OR gate 174 in accordance with the control signal CTL$_{12E}$ by the second decoder 162 at the time of the LP mode.

Concretely, at the time of the LP mode, where the pulse width set up data PWD0 to PWD7 is "FF" and a so-called 100 percent pulse is set up, this first LP gate 171 stops the input of the clock pulse output from the fourth pulse shaper 154 to the 5-input OR gate 174 and suppresses the generation of the reset pulse RST$_E$.

The resetting RP gate 172 controls the input of the clock pulse output from the second pulse shaper 152 to the 5-input OR gate 174 in accordance with the control signal CTL$_{11E}$ by the first decoder 161 at the time of the RP mode.

Concretely, at the time of the RP mode, a reset is forcibly applied on a part of the start of the clock period T irrespective of the value of the pulse width set up data PWD0 to PWD7, and therefore this RP gate 172 is controlled to the open state.

The resetting second LP gate 173 controls the input of the clock pulse output from the third pulse shaper 153 to the 5-input OR gate 174 in accordance with the control signal CTL$_{11E}$ by the first decoder 161 at the time of the LP mode.

The 5-input OR gate 174 takes a logical OR of the output pulses of the resetting first CP gate 169, the resetting second CP gate 170, the resetting first LP mode 171, the resetting RP gate 172, and the resetting second LP gate 173 and outputs the result thereof as the reset pulse RESET$_E$ (hereinafter abbreviated as RST,) to the reset signal input terminal R of the RS-FF circuit 175.

The RS-FF circuit 175 equipped with priority order selection function receives as its input the mode switch signal S$_{13E}$ output from the mode switch signal generation circuit 163 at the mode selection terminal M, performs the switching to the set pulse SET$_E$ priority where the mode switch signal S$_{13E}$ is input at a low level "L", while performs the switching to the reset pulse RST, priority where the mode switch signal S$_{13E}$ is input at a high level "H".

Next, the operation according to the above-described structure will be explained referring to FIGS. 18A to 18L and FIGS. 19A to 19C.

First, a clock signal CLK of a predetermined period is input to the first pulse shaper 151 and the first register 158.

In the first pulse shaper 151, the input clock signal CLK is converted to the clock pulse CLKP$_{1E}$ having a narrow pulse width using the rising edge thereof as a reference. The result is output to the first pulse shaper 152, the first delay circuit 155, and the third register 160. Note that, the width of the clock pulse CLKP$_{1E}$ is converted to a pulse width of an extent such that the pulse will not disappear when passing the first and second delay circuits 155 and 156.

Also, in the first register 158, the 8 bits of pulse width set up data PWD0 to PWD7 for setting the pulse width of the output pulse $PWM_{OUT}$ by the RS-FF circuit 175 fetched into the shifter 157 and the 2 bits of mode set up data PWM0 and PWM1 are fetched and written at a timing of the rising of the input clock signal CLK. The fetched data $D_{8E}$ are output to the second register 159.

In the second pulse shaper 152, the pulse width of the clock pulse $CLKP_{1E}$ output from the first pulse shaper 151 is shaped to further narrow it and the result is output to the setting LP gate 165, the resetting first CP gate 169, and the resetting RP gate 172, respectively.

In the first delay circuit 155, the clock pulse $CLKP_{1E}$ by the first pulse shaper 151 is delayed based on the delay time decoded at the first decoder 161 in accordance with the pulse width set up data PWD and the result is output as the clock pulse $CLKP_{5E}$ to the second delay circuit 156 and the second register 159.

Also, in the first delay circuit 155, the input clock pulse $CLKP_{1E}$ is output as the mode signal $S_{5E}$ from substantially the center position of the respective delay gate groups to the mode switch signal generation circuit 163, and the clock pulse $CLKP_{1E}$ subjected to the predetermined delay function is output from the delay gate in the predetermined stage order to the third pulse shaper 153.

In the second register 159 receiving the clock pulse $CLKP_{5E}$ by the first delay circuit 155, the data $D_{8E}$ held in the first register 158 is fetched and the rewriting of the data is carried out at a timing of the rising of the clock pulse $CLKP_{5E}$. The result is output to the first decoder 161 corresponding to the former half period of the clock and the third register 160.

In the third register 160 receiving the clock pulse $CLKP_{1E}$ output from the first pulse shaper 151, the data $D_{10E}$ held in the second register 159 is fetched and the rewriting of the data is carried out at a timing of rising of the clock pulse $CLKP_{1E}$. The result is output to the second decoder 162 corresponding to the latter half period of the clock. At the same time, the mode pulse width set up data PWM is output to the mode switch signal generation circuit 163.

Also, in the second delay circuit 156 to which the clock pulse $CLKP_{5E}$ subjected to the delaying action at the first delay circuit 155 is input, the clock pulse $CLKP_{5E}$ by the first delay circuit 155 is delayed based on the delay time decoded at the second decoder 162 in accordance with the pulse width set up data PWD and output to the mode switch signal generation circuit 163 as the mode signal $S_{6E}$ from substantially the center position of the respective delay gate groups. The clock pulse $CLKP_{5E}$ subjected to the predetermined delay action is output from the delay gate in the predetermined stage order to the fourth pulse shaper 154.

In the third pulse shaper 153 to which the clock pulse $CLKP_{1E}$ subjected to the delaying action of a predetermined time at the first delay circuit 155 is input, the pulse width of the clock pulse $CLKP_{1E}$ is shaped to further make it narrower. The result is output to the setting CP gate 164, the setting RP gate 166 and the resetting second LP gate 173.

In the fourth pulse shaper 154 to which the clock pulse $CLKP_{5E}$ subjected to the delaying action of a predetermined time at the second delay circuit 156 is input, the pulse width of the clock pulse $CLKP_{5E}$ is shaped to make it further narrower. The result is output to the setting RP gate 167, the resetting second CP gate 170, and the resetting first LP gate 171.

In the first decoder 161 to which the data held in the second register 159 is input, the input data $D_{9E}$ is decoded and which output of the stages of the delay gates should be selected is set before the clock pulse $CLKP_{1E}$ corresponding to the next pulse period T is input to the first delay circuit 155. The result thereof is output to the first delay circuit 155, and the control signal $CTL_{11E}$ in accordance with the set up data and set up mode is produced and output to the respective control terminals of the setting CP gate 164, setting LP gate 165 and the setting first RP gate 166 and the respective control terminals of the resetting first CP gate 169, the resetting RP gate 172, and the resetting second LP gate 173, respectively.

Similarly, in the second decoder 162 to which the data held in the third register 160 is input, the input data $D_{10E}$ is decoded, and which output of the stages of the delay gates should be selected is set before the clock pulse $CLKP_{5E}$ is input to the second delay circuit 156. The result thereof is output to the second delay circuit 156, and the control signal $CTL_{12E}$ in accordance with the set up data and set up mode is produced and output to the control terminal of the setting second RP gate 167 and the respective control terminals of the resetting second CP gate 170 and the resetting first LP gate 171, respectively.

Note that, in the mode switch signal generation circuit 163, the mode switch signal $S_{13E}$ set to a high level "H" or low level "L" in accordance with the input of the mode signal $S_{5E}$ by the first delay circuit 155, the mode signal $S_{6E}$ by the second delay circuit 156, and the mode set up data PWM by the third register 160 is produced and output to the mode selection terminal M of the RS-FF circuit 175 equipped with the priority order selection function.

Here, for example where it is decoded that the set up mode is the RP mode in the first and second decoder 161 and 162, the reset pulse $RST_E$ is generated in the first part of the clock period T, and therefore the resetting RP gate 172 is controlled to an open state based on the control signal $CTL_{12E}$ by the second decoder 162.

By this, the clock pulse $CLKP_{1E}$ subjected to the pulse shaping action of the two stage of the first pulse shaper 151 and the second pulse shaper 152 passes the resetting RP gate 172 and is input to the 5-input OR gate 174 and input to the reset input end R of the RS-FF circuit 175 as the reset pulse $RST_E$, and the output of the pulse is suppressed.

Figure 19A:
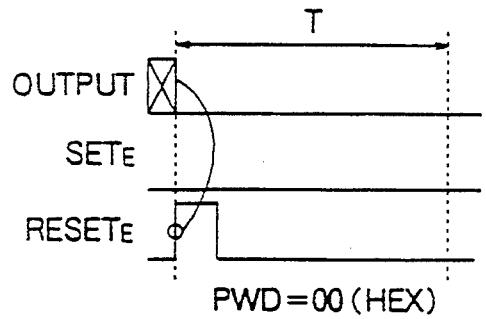
FIGS. 19A to 19C are timing charts for explaining another operation of the pulse width modulation circuit of the present invention shown in FIG. 17.
Figure 19D:
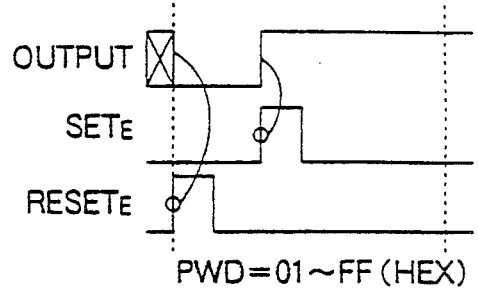

Then, as shown in FIG. 19A, where the value of the pulse width set up data PWD is "01" to "FF" in the RP mode, so as to obtain the pulse output in accordance with the set up data, the setting first RP gate 166 is controlled to the open state based on the control signal $CTL_{11E}$ by the first decoder 161, or the setting second RP gate 167 is controlled to the open state based on the control signal $CTL_{12E}$ by the second decoder 162.

By this, the clock pulse $CLKP_{1E}$ or $CLKP_{5E}$ subjected to the two stage pulse shaping action by the first pulse shaper 151 and the third pulse shaper 153 or the fourth pulse shaper 154 passes the setting first and second RP gates 166 and 167 and is input to the 4-input OR gate 168 and input as the set pulse $SET_E$ to the set signal input terminal S of the RS-FF circuit 175, and the output of the pulse $PWM_{OUT}$ is carried out.

Contrary to this, in the RP mode, when the value of the pulse width set up data PWD is "00" and the 0 percent pulse is set up, as shown in FIG. 19A, so as to suppress the input of the set pulse $SET_E$ to the set signal input terminal S of the RS-FF circuit 175, the setting first RP gate 166 is controlled to the closed state based on the control signal $CTL_{11E}$ by the first decoder 161 or the setting second RP gate 167 is controlled to the closed state based on the control signal $CTL_{12E}$ by the second decoder 162.

Also, for example in the first and second decoders 161 and 162, where it is decoded that the set up mode is the LP mode, so as to generate the set pulse $SET_E$ in the first part of the clock period T, the setting LP gate 165 is controlled to the open state based on the control signal $CTL_{11E}$ by the first decoder 161.

By this, the clock pulse $CLKP_{1E}$ subjected to the two stage pulse shaping action by the first pulse shaper 151 and the second pulse shaper 152 passes the setting LP gate 165 and is input to the 4-input OR gate 168 and input as the set pulse SET, to the set signal input terminal S of the RS-FF circuit 175, and the output of the pulse $PWM_{OUT}$ is carried out.

Figure 19B:
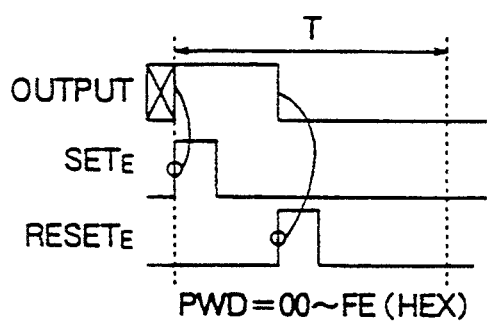
Figure 19E:
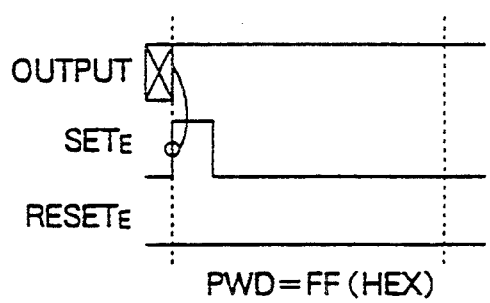

Then, as shown in FIG. 19B, where the value of the pulse width set up data PWD is "00" to "FE" in the LP mode, so as to obtain a pulse output in accordance with the set up data, the resetting second LP gate 173 is controlled to the open state based on the control signal $CTL_{11E}$ by the first decoder 161, or the resetting first LP gate 171 is controlled to the open state based on the control signal $CTL_{12E}$ by the second decoder 162.

By this, the clock pulse $CLKP_{1E}$ or $CLKP_{5E}$ subjected to the two stage pulse shaping action by the first pulse shaper 151 and third pulse shaper 153 or the fourth pulse shaper 154 passes the resetting first and second LP gates 171 and 173 and is input to the 5-input OR gate 174 and input as the reset pulse $RST_E$ to the reset signal input terminal R of the RS-FF circuit 175, and the output of the pulse is suppressed.

Contrary to this, in the LP mode, when the value of the pulse width set up data PWD is "FF" and the 100 percent pulse is set up, as shown in FIG. 19B, so as to suppress the input of the reset pulse RST, to the reset signal input terminal R of the RS-FF circuit 175, the resetting second LP gate 173 is controlled to the closed state based on the control signal $CTL_{11E}$ by the first decoder 161 or the resetting first LP gate 171 is controlled to the closed state based on the control signal $CTL_{12E}$ by the second decoder 162.

Also, for example in the first and second decoders 161 and 162, where it is decoded that the set up mode is the CP mode, so as to generate the reset pulse $RST_E$ in the first part of the clock period T, the resetting first CP gate 169 is controlled to the open state based on the control signal $CTL_{12E}$ by the second decoder 162.

By this, the clock pulse $CLKP_{1E}$ subjected to the two stage pulse shaping action by the first pulse shaper 151 and the second pulse shaper 152 passes the resetting first CP gate 169 and is input to the 5-input OR gate 174 and input as the reset pulse $RST_E$ to the signal reset input terminal R of the RS-FF circuit 175, and the output of the pulse is suppressed.

Figure 19C:
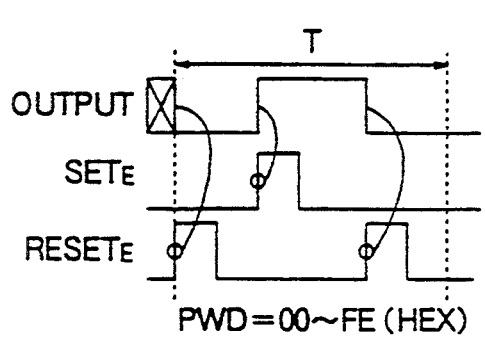
Figure 19F:
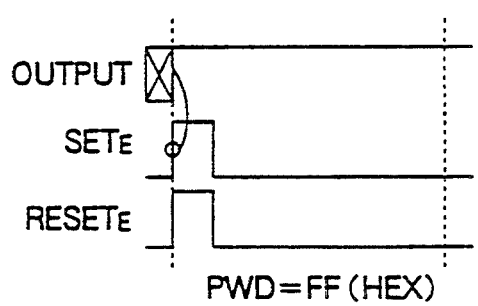

Then, as shown in FIG. 19C, where the value of the pulse width set up data PWD is "00" to "FE" in the CP mode, so as to obtain the pulse output in accordance with the set up data, first, the setting CP gate 164 is controlled to the open state based on the control signal $CTL_{11E}$ by the first decoder 161.

By this, the clock pulse $CLKP_{1E}$ subjected to the two stage pulse shaping action by the first pulse shaper 151 and the second pulse shaper 152 passes the setting CP gate 164 and is input to the 4-input OR gate 168 and input as the set pulse $RST_E$ to the set signal input terminal S of the RS-FF circuit 175, and the output of the pulse $PWM_{OUT}$ is carried out.

Subsequently, so as to suppress the pulse output, the resetting second CP gate 170 is controlled to the open state based on the control signal $CTL_{12E}$ by the second decoder 162.

By this, the clock pulse $CLKP_{5E}$ subjected to the two stage pulse shaping action by the first pulse shaper 151 and the fourth pulse shaper 154 passes the resetting second CP gate 170 and is input to the 5-input OR gate 174 and input as the reset pulse $RST_E$ to the reset signal input terminal R of the RS-FF circuit 175, and the output of the pulse is suppressed.

Contrary to this, in the CP mode, where the value of the pulse width set up data PWD is "FF" and the 100 percent pulse is set up, as shown in FIG. 19C, so as to suppress the reset input of the latter half, the resetting second CP gate is controlled to the closed state based on the control signal $CTL_{12E}$ by the second decoder 162 and the input of the reset pulse $RST_E$ to the reset signal input terminal R of the RS-FF circuit 175 is suppressed.

As explained above, according to the present embodiment, at the time of the RP mode, the input of the set pulse $SET_E$ to the set signal input terminal S of the RS-FF circuit 175 is suppressed at the time of a 0 percent pulse set up; at the time of the LP mode, the input of the reset pulse $RST_E$ to the reset signal input terminal R of the RS-FF circuit 175 is suppressed at the time of a 100 percent pulse set up; at the time of the CP mode, the reset pulse $RST_E$ is forcibly input to the reset signal input terminal R of the RS-FF circuit 175 in the first part of the clock period T; and the input of the reset pulse $RST_E$ to the reset signal input terminal R of the RS-FF circuit 175 is suppressed in the latter half at the time of the 100 percent pulse set up, and therefore the generation of a blank pulse and offset pulse at the time of a 100 percent and 0 percent pulse set up can be prevented, and a higher precision gradation expression can be realized.

Also, the generation of a blank pulse and offset pulse, which have been conventionally caused due to a certain combination of pulse modes and pulse width set up value, can be reduced.

Figure 1:
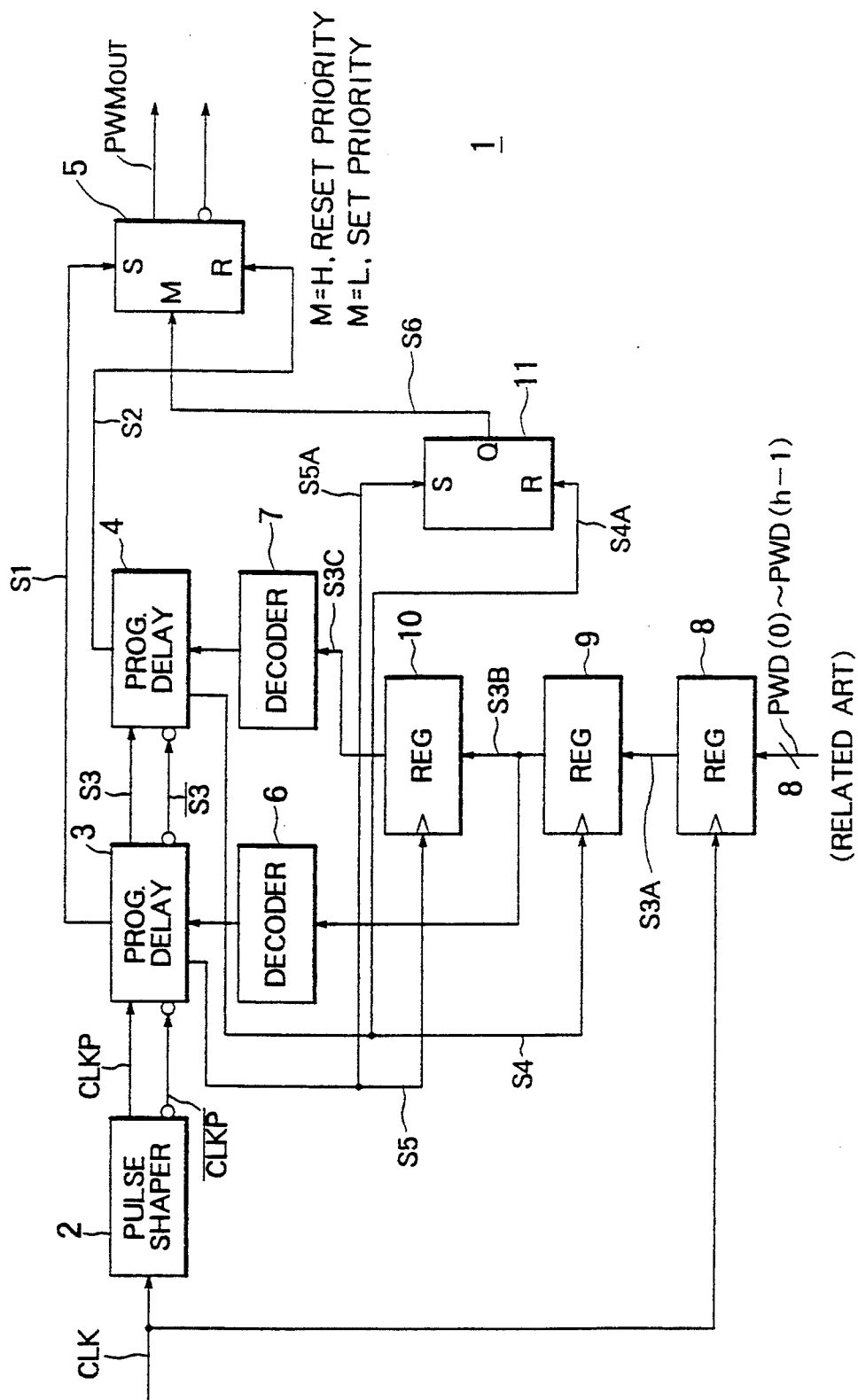
FIG. 1 shows the structure of a pulse width modulation circuit of the related art.

FIGS. 20A to 20I, to FIGS. 28A to 28I are waveform diagrams showing the output pulse in the various combinations of the CP mode, LP mode, and RP mode where a countermeasure is carried out using the circuit of FIG. 1.

Namely, FIGS. 20A to 20I show the output pulses in the case of CP to CP; FIGS. 21A to 21I show the output pulses in the case of CP to LP; FIGS. 22A to 22I show the output pulses in the case of CP to RP; FIGS. 23A to 23I show the output pulses in the case of LP to CP; FIGS. 24A to 24I show the output pulses in the case of LP to LP; FIGS. 25A to 25I show the output pulses in the case of LP to RP; FIGS. 26A to 26I show the output pulses in the case of RP to CP; FIGS. 27A to 27I show the output pulses in the case of RP to LP; and FIGS. 28A to 28I show the output pulses in the case of RP to RP; respectively.

AS seen from the comparison of these views with FIG. 5 to FIG. 8, which are waveform diagrams of output pulses of the related art of the circuit, the number of combinations of modes generating the blank pulse and offset pulse is reduced from 18 to seven.

Particularly, the generation of a large blank pulse and offset pulse as shown in FIG. 5, FIG. 6 FIG. 7, and FIG. 8 can be prevented.

Also, according to this embodiment, for the input clock CLK, first, the pulse width is made narrow by the first pulse shaper 151 as the first stage to such an extent that the pulse will not disappear when passing the first and second delay circuits 155 and 156, and the pulse width thereof is made further narrower by the second to fourth pulse shapers 152 to 154 as the second stage, and then the set pulse $SET_E$ and the reset pulse $RST_E$ are input to the set signal input terminal S and reset signal input terminal R of the RS-FF circuit 175, respectively, and therefore the blank pulse and the offset pulse can be suppressed to the degree of about a minimum pulse width at which the RS-FF circuit 175 can operate.

In this way, the blank pulse and the offset pulse can be suppressed to several hundreds ps by constructing the pulse shaper by two stages.

For example, assuming a pulse width modulation of 20 MHz and an 8-bit resolution, the blank pulse and offset pulse of several hundreds ps are about 1 to 2 LSB and exert substantially no influence upon the resolution in the final laser beam printers and digital copying machines.

Note that, in this embodiment, the timings of set input and reset input are matched by the priority mode of the RS-FF circuit 175 and pulses of 0 percent and 100 percent are generated, but of course it is also possible to constitute the apparatus so that the set input and reset input are generated under limitations not according to the mode.

As explained above, according to this invention, generation of the blank pulse and offset pulse at the time of a so-called 100 percent and 0 percent set up can be prevented.

Also, generation of the blank pulse and offset pulse generated according to a certain combination of pulse modes and pulse width set up values can be reduced.

Accordingly, there is an advantage that higher precision gradation expression becomes possible and so on.

What is claimed is:

1. A pulse width modulation circuit which delays a control pulse input at every predetermined period by an arbitrary time via delay means, inputs delayed control pulses to a set signal input terminal and reset signal input terminal of latch means, respectively, and modulates the pulse width of the output pulse output from the latch means based on the delayed control pulses input to the set input terminal and reset input terminal, characterized in that said pulse width modulation circuit comprises a control means including a reference signal generation means comprising delay elements having a delay time equivalent to that of delay elements constituting said delay means, and said control means performing a phase comparison between the frequency of an output reference signal of said reference signal generating means and the frequency of said control pulse input to said delay means, and controlling the delay time of said delay means based on a difference of the phase relationship of the two.

2. A pulse width modulation circuit which delays a control pulse input at every predetermined period by an arbitrary time via delay means, inputs delayed control pulses to a set signal input terminal and reset signal input terminal of latch means, respectively, and modulates the pulse width of the output pulse output from the latch means based on the delayed control pulses input to the set signal input terminal and reset signal input terminal, characterized in that said pulse width modulation circuit comprises a control means including a ring oscillator using delay elements having a delay time of 1/n based on the entire delay time of said delay means, a first frequency-dividing means for dividing the frequency of the output signal of said ring oscillator by n, a second frequency dividing means for dividing the frequency of the control pulse to be input to said delay means by a predetermined frequency dividing ratio, and a phase comparison means for performing a phase comparison between the output signal of said first frequency dividing means and the output signal of the second frequency dividing means, and said control means controlling the delay time of said delay means based on the difference of the phase relationship obtained by said phase comparison means.

3. A pulse width modulation circuit which delays a control pulse input at every predetermined period by an arbitrary time via delay means, inputs delayed control pulses to a set signal input terminal and reset signal input terminal of latch means, respectively, and modulates the pulse width of the output pulse output from the latch means based on the delayed control pulses input to the set signal input terminal and reset signal input terminal, characterized in that it comprises a means for making said control pulse pass through said delay means exactly a number of times in accordance with an operation frequency and generating an input timing of the delayed control pulses to the set signal input terminal and the reset signal input terminal of said latch means.

4. A pulse width modulation circuit capable of varying a timing of a pulse output in accordance with a set up mode, which delays a control pulse input at every predetermined period by an arbitrary time via delay means, inputs delayed control pulses to a set signal input terminal and reset signal input terminal of latch means, respectively, and modulates a pulse width of an output pulse output from the latch means based on the delayed control pulses input to the set signal input terminal and reset signal input terminal, characterized in that it comprises a pulse input control means for controlling the input of the delayed control pulses to the set signal input terminal and the reset signal input terminal of said latch means in accordance with the set up mode.

5. A pulse width modulation circuit according to claim 4, wherein said pulse input control means performs said input control at the time of a full pulse output where the pulse is output over the entire period of one period of the control pulse or at the time of non-pulse output where the pulse output is stopped over the entire period.

6. A pulse width modulation circuit according to claim 4, wherein provision is made of a pulse shaping means for dividing the pulse width of said control pulse into a plurality of stages to make the pulse narrower.

7. A pulse width modulation circuit, comprising:
a pulse generation circuit receiving a period reference pulse signal having a pulse width defining a period, and generating an internal pulse signal in response to the level change of said period reference pulse signal, a pulse width of said internal pulse signal being smaller than that of said period reference pulse signal;

a delay circuit including a plurality of gates connected in series, and delaying said internal pulse signal by passing through said gates;

a delay time control circuit including, a reference signal generation circuit having a plurality of ring-connected gates substantially the same as said gates in said delay circuit and generating a reference signal having a frequency, and a phase-difference signal generation circuit generating a delay time control signal having an amplitude corresponding to a phase difference between said reference signal and said internal pulse signal;

said gates in said delay circuit being controlled to change a delay time of said internal pulse signal by said delay time control signal, a set pulse generation circuit receiving delayed internal pulse signals from said gates in said delay circuit and outputting a delayed internal pulse signal corresponding to a first pulse width data for defining a set pulse output timing, said delayed internal pulse signal being a set pulse signal;

a reset pulse generation circuit receiving delayed internal pulse signals from said gates in said delay circuit and outputting another delayed internal pulse signal corresponding to a second pulse width data for defining a reset pulse output timing, said another delayed internal pulse signal being a reset pulse signal; and a latch circuit outputting an energization level signal when said set pulse signal is applied and outputting a deenergization level signal when said reset pulse signal is applied, a width of said energization level signal defining a value of a pulse width modulation.

8. A pulse width modulation circuit according to claim 7, wherein each of said gates in said delay circuit comprises a differential input stage formed by an ECL differential-pair circuit, and an emitter-follower output stage connected to said differential input stage, and comprising two parallel-connected output transistors connected to output terminals of said ECL differential-pair circuit, and two current sources including current source transistors, wherein said pulse generation circuit generates complementary internal pulse signals and applies them to said differential input stage, and wherein said current source transistors in said two current sources are controlled by said delay time control signal from said delay time control circuit, to thereby control the output time of output signal at said two output transistors.

9. A pulse width modulation circuit according to claim 8, wherein each of said gates in said reference signal generation circuit of said delay time control circuit comprises a differential input stage formed by an ECL differential-pair circuit, and an emitter-follower output stage connected to said differential input stage, and comprising two parallel-connected output transistors connected to output terminals of said ECL differential-pair circuit, and two current sources including current source transistors, said current source transistors being controlled by said delay time control signal.

10. A pulse width modulation circuit according to claim 7, wherein said latch circuit comprises a set-reset type flip-flop.

* * * * *